(12) United States Patent
Mirov et al.

(10) Patent No.: US 8,767,789 B2
(45) Date of Patent: Jul. 1, 2014

(54) MID-IR MICROCHIP LASER: ZNS:CR$^{2+}$ LASER WITH SATURABLE ABSORBER MATERIAL

(75) Inventors: Sergey B. Mirov, Vestavia Hills, AL (US); Vladimir V. Fedorov, Birmingham, AL (US)

(73) Assignee: The UAB Research Foundation, Birmingham, AL (US)

(*) Notice: Subject to any disclaimer, the term of this patent is extended or adjusted under 35 U.S.C. 154(b) by 0 days.

(21) Appl. No.: 13/309,496

(22) Filed: Dec. 1, 2011

(65) Prior Publication Data

US 2012/0224599 A1    Sep. 6, 2012

Related U.S. Application Data

(60) Continuation of application No. 12/485,826, filed on Jun. 16, 2009, now abandoned, which is a continuation of application No. 11/140,271, filed on May 27, 2005, now Pat. No. 7,548,571, which is a division of application No. 10/247,272, filed on Sep. 19, 2002, now Pat. No. 6,960,486.

(60) Provisional application No. 60/323,551, filed on Sep. 20, 2001.

(51) Int. Cl.
*H01S 3/063* (2006.01)
*H01S 3/0941* (2006.01)
*H01S 3/115* (2006.01)
*H01S 3/117* (2006.01)
*H01S 3/08* (2006.01)
*H01S 3/108* (2006.01)
*H01S 3/16* (2006.01)
*H01S 3/1055* (2006.01)
*H01S 3/094* (2006.01)

(52) U.S. Cl.
CPC ........... *H01S 3/08009* (2013.01); *H01S 3/0805* (2013.01); *H01S 3/115* (2013.01); *H01S 3/117* (2013.01); *H01S 3/108* (2013.01); *H01S 3/162* (2013.01); *H01S 3/08086* (2013.01); *H01S 3/1055* (2013.01); *H01S 3/094042* (2013.01); *H01S 3/094046* (2013.01); *H01S 3/09415* (2013.01)
USPC .. 372/50.11; 372/43.01; 372/23; 372/50.121; 372/50.23; 372/75; 372/102

(58) Field of Classification Search
CPC ......... H01S 3/108; H01S 3/115; H01S 3/117; H01S 3/162; H01S 3/08; H01S 3/08009; H01S 3/0805; H01S 3/1055; H01S 3/094042; H01S 3/094046; H01S 3/09415; H01S 3/08086
USPC ................. 372/19, 20, 23, 102, 43.01, 50.11, 372/50.121, 75, 50.23
See application file for complete search history.

(56) References Cited

U.S. PATENT DOCUMENTS 3,820,896 A * 6/1974 Stavis .............................. 356/28
4,762,382 A * 8/1988 Husain et al. .................. 385/132

(Continued)

*Primary Examiner* — Mary Wilczewski
(74) *Attorney, Agent, or Firm* — Perkins Coie LLP

(57) ABSTRACT

A method of fabrication of laser gain material and utilization of such media includes the steps of introducing a transitional metal, preferably Cr$^{2+}$ thin film of controllable thickness on the ZnS crystal facets after crystal growth by means of pulse laser deposition or plasma sputtering, thermal annealing of the crystals for effective thermal diffusion of the dopant into the crystal volume with a temperature and exposition time providing the highest concentration of the dopant in the volume without degrading laser performance due to scattering and concentration quenching, and formation of a microchip laser either by means of direct deposition of mirrors on flat and parallel polished facets of a thin Cr:ZnS wafer or by relying on the internal reflectance of such facets. Multiple applications of the laser material are contemplated in the invention.

6 Claims, 19 Drawing Sheets

(56) References Cited

U.S. PATENT DOCUMENTS

| | | | |
|---|---|---|---|
| 5,009,502 A * | 4/1991 | Shih et al. | 356/152.1 |
| 5,379,310 A * | 1/1995 | Papen et al. | 372/23 |
| 5,461,635 A * | 10/1995 | Basiev et al. | 372/42 |
| 5,541,948 A * | 7/1996 | Krupke et al. | 372/41 |
| 6,326,666 B1 * | 12/2001 | Bernstein et al. | 257/347 |
| 6,960,486 B2 * | 11/2005 | Mirov et al. | 438/45 |
| 6,970,494 B1 * | 11/2005 | Bendett et al. | 372/102 |
| 7,194,016 B2 * | 3/2007 | Bullington et al. | 372/108 |
| 7,519,246 B2 * | 4/2009 | Welch et al. | 385/14 |
| 7,548,571 B2 * | 6/2009 | Mirov et al. | 372/49.01 |
| 7,672,546 B2 * | 3/2010 | Welch et al. | 385/14 |
| 7,676,122 B2 * | 3/2010 | Dou et al. | 385/14 |
| 7,680,368 B2 * | 3/2010 | Welch et al. | 385/14 |
| 7,751,658 B2 * | 7/2010 | Welch et al. | 385/14 |
| 7,773,837 B2 * | 8/2010 | Welch et al. | 385/14 |
| 7,792,396 B2 * | 9/2010 | Kish et al. | 385/14 |
| 7,885,492 B2 * | 2/2011 | Welch et al. | 385/14 |
| 8,288,157 B2 * | 10/2012 | Duer | 435/288.7 |
| 8,300,994 B2 * | 10/2012 | Welch et al. | 385/14 |
| 2012/0224599 A1 * | 9/2012 | Mirov et al. | 372/49.01 |

* cited by examiner

MID-IR MICROCHIP LASER: ZNS:CR$^{2+}$ LASER WITH SATURABLE ABSORBER MATERIAL

This patent application is a continuation of U.S. patent application Ser. No. 12/485,826, filed Jun. 16, 2009, which is a continuation of U.S. patent application Ser. No. 11/140,271, filed May 27, 2005, now U.S. Pat. No. 7,548,571, which is a divisional of U.S. patent application Ser. No. 10/247,272, filed Sep. 19, 2002, now U.S. Pat. No. 6,960,486, which claims benefit of U.S. Provisional Patent Application No. 60/323,551, filed Sep. 20, 2001. The disclosures of the prior applications are considered part of (and are incorporated by reference in) the disclosure of this application.

FIELD OF THE INVENTION

The present invention relates to the field of Quantum Electronics, and more particularly to the elemental basis of laser technology, and can be used to develop tunable mid-infrared (mid-IR) solid state lasers.

Primarily, the invention can be used in cases where monochromatic laser emissions tunable in the middle-infrared spectral region are required for solving problems in various fields of science and technology, such as laser spectroscopy, trace gas analysis, photo chemistry, photo biology, medicine, and wavelength specific military applications, among others.

BACKGROUND OF THE INVENTION

There is a growing demand for affordable mid-infrared sources for use in a variety of applications including atmospheric sensing (global wind sensing and low altitude wind shear detection), eye-safe medical laser sources for non-invasive medical diagnostics, eye-safe laser radar and remote sensing of atmospheric constituents, optical communication, and numerous military applications such as target designation, obstacle avoidance and infrared counter measures. These applications rely on the existence of "spectroscopic fingerprints" of numerous organic molecules in the mid-IR range.

Recent research advances have spurred considerable effort in the development of practical mid-IR sources. This work has included direct generation in semiconductors using InAsSbP/InAsSb/InAs,[1] and quantum cascade lasers[2]. Mid-IR wavelengths have also been generated using nonlinearities in Optical Parametric Oscillators[3] and difference frequency generators.[4,5] All of these approaches yield tunable sources in the mid-IR and all suffer some fundamental problems that limit their use as robust low cost mid-IR source. Furthermore, to date, all of these sources have limited output powers that preclude their use in higher power applications such as remote sensing.

In contrast to the relatively large body of work using the approaches described above, there has been relatively little investigation of the potential for direct oscillation from divalent transitional metal ions (TM$^{2+}$) placed in the asymmetric ($T_d$) lattice sites of the wide bandgap binary and mixed ternary II-VI semiconductor crystals. The lack of work on direct emission of chromium doped (or other transitional metal doped) sources in the mid-IR has one primary cause. Long wavelength TM emissions are quenched by multi-photon processes in conventional laser host media such as oxide and fluoride crystals, resulting in extremely low room-temperature quantum efficiency of fluorescence.

Recently, mid-IR laser activity near 2-4 μm was reported for Cr:ZnS[6,7,8,9,10], Cr:ZnSe[6,7,11,12,13,14,15,16,17,18], Cr:Cd$_{1-x}$Mn$_x$Te[19], Cr:CdSe[20], and Fe$^{2+}$:ZnSe[21] crystals. These TM doped II-VI compounds have a wide bandgap and possess several important features that distinguish them from other oxide and fluoride laser crystals. First is the existence of chemically stable divalent TM dopant ions, which substitute Zn$^{2+}$ or Cd$^{2+}$ host ions, with no need for charge compensation. An additional feature of the II-VI compounds is their tendency to crystallize in tetrahedrally coordinated structures. As opposed to the typical octahedral coordination at the dopant site, tetrahedral coordination gives smaller crystal field splitting, placing the dopant transitions further into the IR. Finally, a key feature of these materials is a poor phonon spectrum that makes them transparent in a wide spectral region, decreases the efficiency of non-radiative decay and gives promise to a high yield of fluorescence at room temperature.

In terms of merit for high average power applications, it is known that some of chalcogenides (e.g. ZnS and ZnSe) feature excellent thermo-mechanical properties, having thermal shock resistance values comparable to and coefficient of thermal conductivity better than such thermo-mechanically robust materials as YAG crystals. Given the attractive thermo-mechanical, spectroscopic properties of TM$^{2+}$, and nice overlap of the Cr$^{2+}$ absorption and emission Er and Tm fiber lasers as well as of stained layer InGaAsP/InP and, theoretically, InGaNAs/GaAs diode lasers, directly fiber or diode-pumped wide band semiconductor crystals doped with TM ions can be considered as very promising and effective systems for medicine, remote sensing, trace gas analysis, and high power wavelength specific military applications.

The studies of TM$^{2+}$ doped II-VI materials showed that in terms of spectroscopic and laser characteristics these media are very close mid-IR analogues of the titanium-doped sapphire (Ti—S). It is anticipated that, similarly to the Ti—S laser, TM$^{2+}$ doped chalcogenides will be lasing in the near future with a great variety of possible regimes of oscillations, but with an additional significant advantage of being directly pumpable with radiation of InGaAsP or InGaNAs diode arrays.

During the last 2-7 years several groups, including the inventors, have actively explored analogues TM$^{2+}$ crystal hosts for tunable lasing in CW, free-running long pulse, Q-switched and mode-locked regimes of operation. So far the most impressive results—room temperature operation, >60% lasing efficiency, 3.7 W of output power, more than 1000 nm range of tunability—have been obtained using Cr$^{2+}$:ZnSe crystals. Based on these results, it appears that Cr doped ZnS and ZnSe crystals possess a unique combination of technological, thermo-mechanical, spectroscopic, and laser characteristics that make them potentially low cost, affordable mid-IR laser sources.

However, in these spectroscopic and laser studies of TM$^{2+}$: II-VI materials there was no indication that microchip lasers and chip-scaled integrated lasers could be designed on the basis of TM doped II-VI hosts. Microchip lasing requires several specific factors in addition to standard factors required for any laser media. These additional factors are high optical density and high gain of thin layers (usually <1-2 mm) of active material, which is translated into high cross sections of absorption and emission, combined with a high doping levels of active ions at which there is still no concentration quenching of fluorescence and no degradation of the optical quality of the host material.

Also unknown in the prior art is a design of "spatially dispersive" cavities for realization of flexible laser modules easily reprogrammable from monochromatic to ultrabroadband and multiline regimes of operation.

U.S. Pat. Nos. 5,461,635 and 6,236,666 taught the approach of superbroadband (SBL) or multiwavelength system[22,23,24,25] based on spatial separation of different wavelengths in a single laser cavity. The optical components of the cavity maintain distinct gain channels in the active zone of semiconductor chip, reduce cross talk, suppress mode competition, and force each channel to lase at a specific stabilized wavelength. By designing this cavity structure appropriately, the system creates its own microcavities each lasing at different wavelengths across the complete gain spectrum of the active material. The system is ideal from the point of view of control of laser wavelengths generated in a common laser cavity and allows the obtaining of very small and controllable wavelength spacing. This approach allows the construction of a laser that emits a plurality of narrow spectral lines that can be easily tailored to any pre-assigned spectral composition within the amplification spectrum of the gain medium. This approach has been demonstrated for the emission of thirty lines in laboratory conditions and the stability and line width measurements are extremely promising. Conventional tunable laser systems used for remote sensing are appropriate only for single element analysis. Proposed simple, flexible and easily reprogrammable laser modules open new opportunities for simultaneous multi-element gas tracing analysis. It appears that TM doped II-VI hosts and, specifically, chromium doped ZnS and ZnSe crystals featuring broad amplification spectra are ideal active media for superbroadband and multiline lasing.

Finally, the prior art has not taught utilization of acousto-optic, electro-optic, photorefractive and birefringent properties of II-VI crystals in one integrated microchip system combining active medium, acousto- or electro-optic modulator, filter, other passive components of the cavity such as waveguide grating, or birefringent filter.

SUMMARY OF THE INVENTION

The present invention contemplates a new class of middle-infrared microchip lasers based on transitional metal ($TM^{2+}$= Ti, V, Cr, Mn, Fe, Co, Ni, and Cu) doped binary II-VI crystals having formula MeZ, where Me being Zn, Cd, Ca, Mg, Sr, Ba, Hg, Pb and Z being S, Se, Te, O and their mixtures as well as mixed ternary chalcogenide matrixes having formula $MeX_2Z_4$ with X being Ga, In, Al. A particular embodiment of this invention is microchip laser based on $Cr^{2+}$ doped ZnS, ZnSe, CdS, and CdSe crystals. The microchip laser is the most compact and simplest diode or fiber laser pumped solid state laser with a typical dimension of 0.5-1 $mm^3$. The main advantages of the proposed microchip lasers will be the ability to be fabricated with collective fabrication processes allowing low cost mass production with good reproducibility and reliability as well as simplicity, allowing its utilization without any optical alignment and maintenance.

The following steps are germane to the practice of the invention. Growing (Chemical, Physical Vapor Transport or other methods) or purchasing II-VI host crystal materials from commercial vendors followed by cutting them into polished wafers of thickness 0.1-3 mm.

Introducing transitional metal (e.g. Cr) thin film of controllable thickness on the crystal facets at the stage after crystal growing by means of pulse laser deposition, plasma sputtering, cathode arc deposition, or other methods, Thermal annealing of the crystals under simultaneous action of electric field for effective thermal diffusion of the dopant into the crystal volume with a temperature and exposition time providing highest concentration of the dopant in the volume without degrading laser performance due to scattering and concentration quenching, Polishing Microchip Facets, formation of microchip laser by means of direct deposition of mirrors on flat and parallel polished facets of a thin TM:II-VI wafer.

The microchip laser thus fabricated can utilize direct diode or fiber laser pumping with a level of power density providing formation of positive lens and corresponding cavity stabilization as well as threshold population inversion in the laser material.

The present invention by taking advantage of acousto-optic, electro-optic, photorefractive and birefringent properties of II-VI crystals also contemplates an integrated microchip system combining active medium, acousto- or electro-optic modulator, filter, other passive components of the cavity such as waveguide grating, or birefringent filter.

The present invention further contemplates microchip lasers integrated into "spatially dispersive" cavities for realization of flexible laser modules easily reprogrammable from monochromatic to ultrabroadband and multiline regimes of operation.

The advantages of the present invention will be further appreciated from the drawings and from the detailed description provided below.

BRIEF DESCRIPTION OF THE DRAWINGS

The herein described features of the present invention, as well as others which will become apparent, are attained and can be understood in more detail by reference to the following description and appended drawings, which form a part of this specification. It is to be noted, however, that the appended drawings illustrate only exemplary embodiments of the invention and therefore not be considered limiting of its scope, for the invention may admit other equally effective embodiments.

DESCRIPTION OF THE PREFERRED EMBODIMENT

Figure 1:
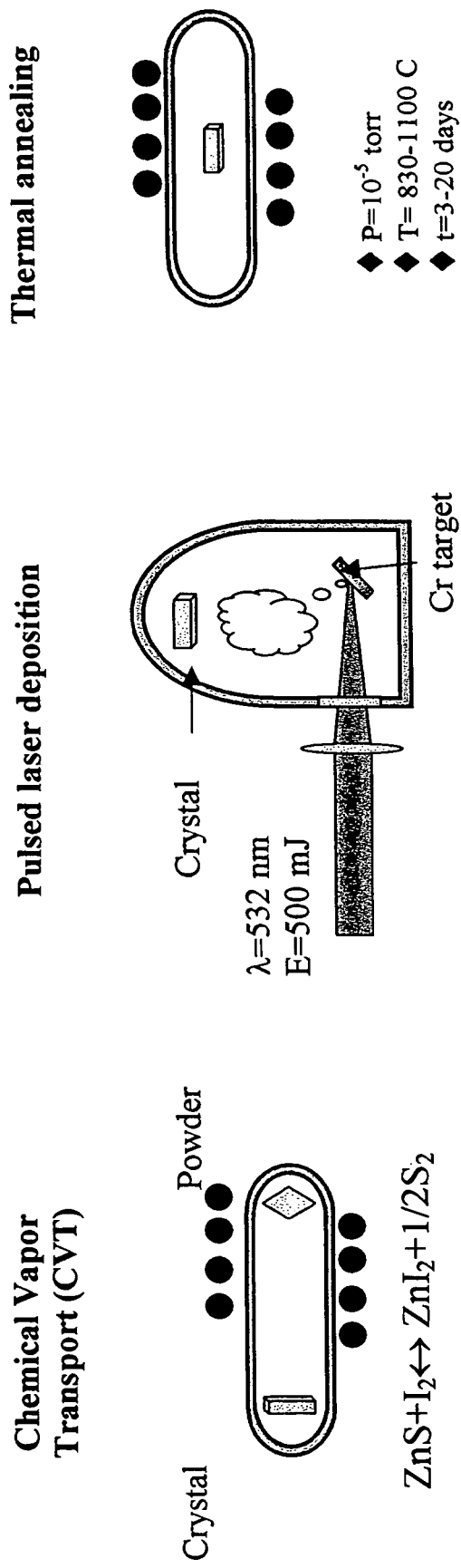
FIG. 1 is a flow chart of an embodiment of a three-stage method for producing transitional method doped wafer according to the present invention that will be further diced into numerous microchip active elements.

In the preferred embodiment, the $Cr^{2+}$:ZnS crystals are prepared by a three-stage method according to a flow chart depicted in FIG. 1. At the first stage, undoped single crystals are synthesized by a chemical transport reaction from gas phase using an iodine gas transport scheme, preferably in a quartz tube 20 mm in diameter and 200 mm in length placed in a two heating zone furnace. Powder obtained by a joint ignition of initial components serves as raw material. Temperatures in the zones of raw material and crystallization are approximately 1200° C. and 1100° C. respectively. $I_2$ concentration is in the range of 2-5 mg/cm$^3$. High optical quality unoriented ingots, preferably Ø2×cm$^3$, are cut and ground to slabs of 5×5×3 mm size.

At the second stage and third stages, introduction of chromium (or other transitional metal) into the crystalline host is performed by thermal diffusion (third stage) from a then film deposited, preferably, by the pulse laser deposition method (second stage). Plasma sputtering or other thin-film deposition methods could also be sued. Thermal annealing can be carried out in sealed ampoules under a pressure of, preferably, approximately 10$^{-5}$ torr and temperature of approximately 830° to approximately 1100° C. over 3 to 20 days. In some cases to provide more effective thermo-diffusion it was performed under simultaneous action of electric field of 1-30 kV/cm magnitude with positive terminal being applied to Cr film and negative—to the Ag electrode deposited on the opposite surface of the wafer. Polished samples of 1-3 mm thickness and up to 5 mm aperture can then be produced.

Figure 2:
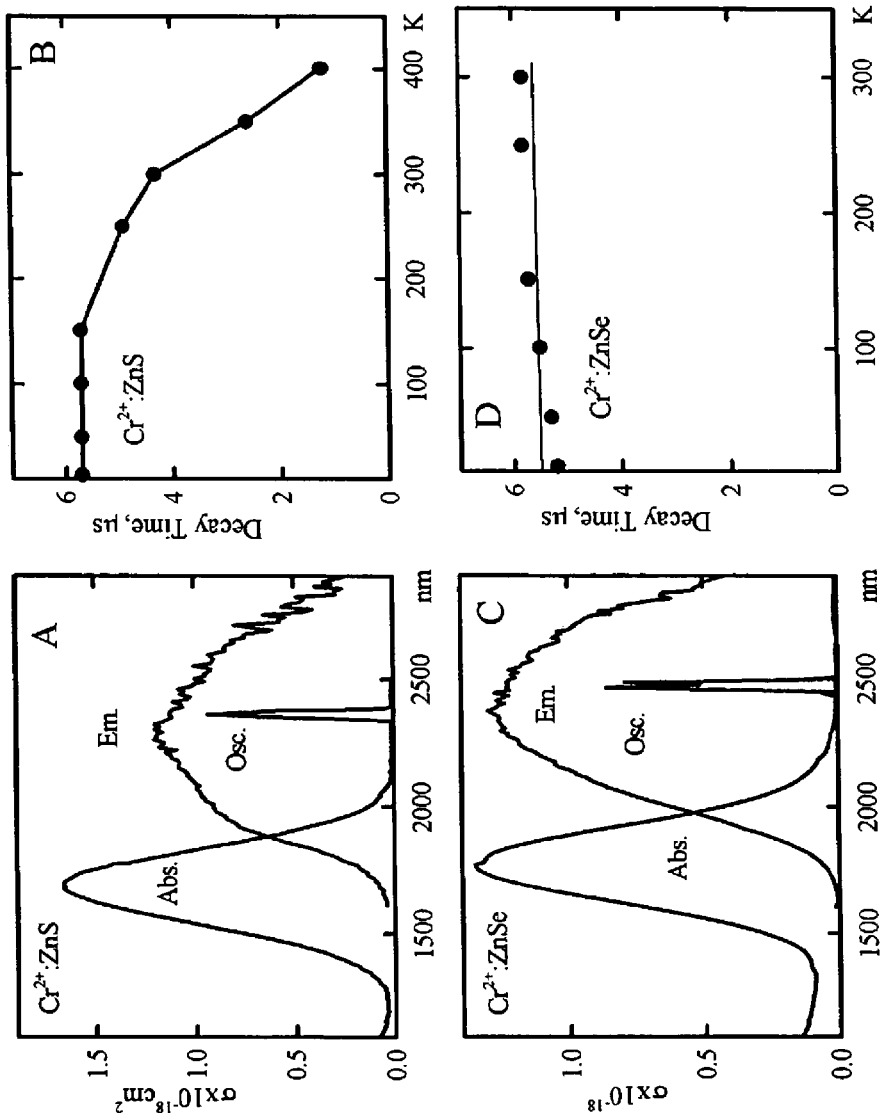
FIG. 2 is a graph of room temperature absorption and emission spectra of $Cr^{2+}$:ZnS (A) and $Cr^{2+}$:ZnSe (C) crystals prepared according to the invention, measured at 300K, and plotted in cross-sectional units, and corresponding emission lifetime temperature dependences (B, D).

The room-temperature absorption and fluorescence spectra of the studied $Cr^{2+}$:ZnS and $Cr^{2+}$:ZnSe crystals are given in cross section units in FIGS. 2A and 2C, respectively. The absorption spectra were measured using a (Shimadzu UV-VIS-NIR-3101PC) spectrophotometer. The fluorescence spectra were measured using an (Acton Research ARC-300i) spectrometer and a liquid nitrogen cooled (EGG Judson J10D-M204-R04M-60) InSb detector coupled to amplifier (Perry PA050). This InSb detector-amplifier combination featured a temporal resolution of 0.4 μs. The fluorescence spectra were corrected with respect to the spectral sensitivity of the recording system using a tungsten halogen calibration lamp (Oriel 9-2050). As an excitation source we used CW Erbium doped fiber laser (IPG Photonics, ELD-2), modulated at 800 Hz. It is noteworthy that $Cr^{2+}$:ZnSe crystals did not exhibit any polarization dependence of the absorption and the difference due to the polarization dependence of the absorption and fluorescence spectra for Cr:ZnS did not exceed 10% at room temperature. This allowed us to treat the studied crystal in the first approximation as optically isotropic.

The luminescence kinetics of the crystals were measured at 1950, 2100, 2400, and 2600 nm across a broad temperature range using $D_2$ and $H_2$ Raman-shifted Nd:YAG laser excitation at 1560 and 1907 nm. Within the 0.4 μs accuracy of measurements there was no difference in the lifetime of luminescence for different wavelengths of excitation and registration. FIG. 2B shows that the emission lifetime drops only slightly for ZnS, i.e. from 5.7 to 4.3~s, between 14 and 300° K and is practically unchanged for ZnSe (FIG. 2D). This shows that quenching is not important below 300° K.

The spontaneous-emission cross-sections $\sigma_{em}(\lambda)$ (FIGS. 2A and 2C) were obtained from fluorescence intensity signal $I(\lambda)$ using the Fuchtbauer-Ladenburg equation:

$$\sigma_{em}(\lambda) \frac{\lambda^5 I_\lambda(\lambda) A}{8\pi n^2 c \int I_\lambda(\lambda) d\lambda}, \tag{1}$$

where A is the spontaneous emission probability from the upper laser level, and n is the index of refraction.

To derive the absorption cross-section magnitude from the "absorption spectrum, one needs to know the $Cr^{2+}$ concentration. Unfortunately, the absolute dopant concentration is neither uniform nor accurately known in the case of diffusion doping. We therefore used the reciprocity method for the broadband transition:

$$\sigma_a(\lambda) = \sigma_{em}(\lambda) \frac{g_2}{g_1} \exp\left(\frac{hc/\lambda - E_{ZFL}}{kT}\right) \tag{2}$$

in conjunction with measured absorption spectra to calculate the absorption cross-section in FIG. 2A,C, making use of the known ground and upper level degeneracies $g_1=3$ and $g_2=2$, respectively. Here $E_{ZFL}$ is the energy of the zero phonon line of the corresponding transition, k is the Boltzmann constant, and T is the temperature. We also assumed that the Jahn-Teller splitting of both upper ands lower levels can be neglected, as it is less or comparable to kT at room temperature. Our value for the peak absorption cross-section of $\sigma_a=1.6\times10^{-18}$ cm$^2$ at $\lambda=1690$ nm for Cr$^{2+}$:ZnS agrees reasonably well with the value of $\sigma_a=1.0\times10^{-18}$ cm$^2$ known in the prior art and obtained using the absorption coefficient and the known concentration of Cr$^{2+}$.

Figure 3:
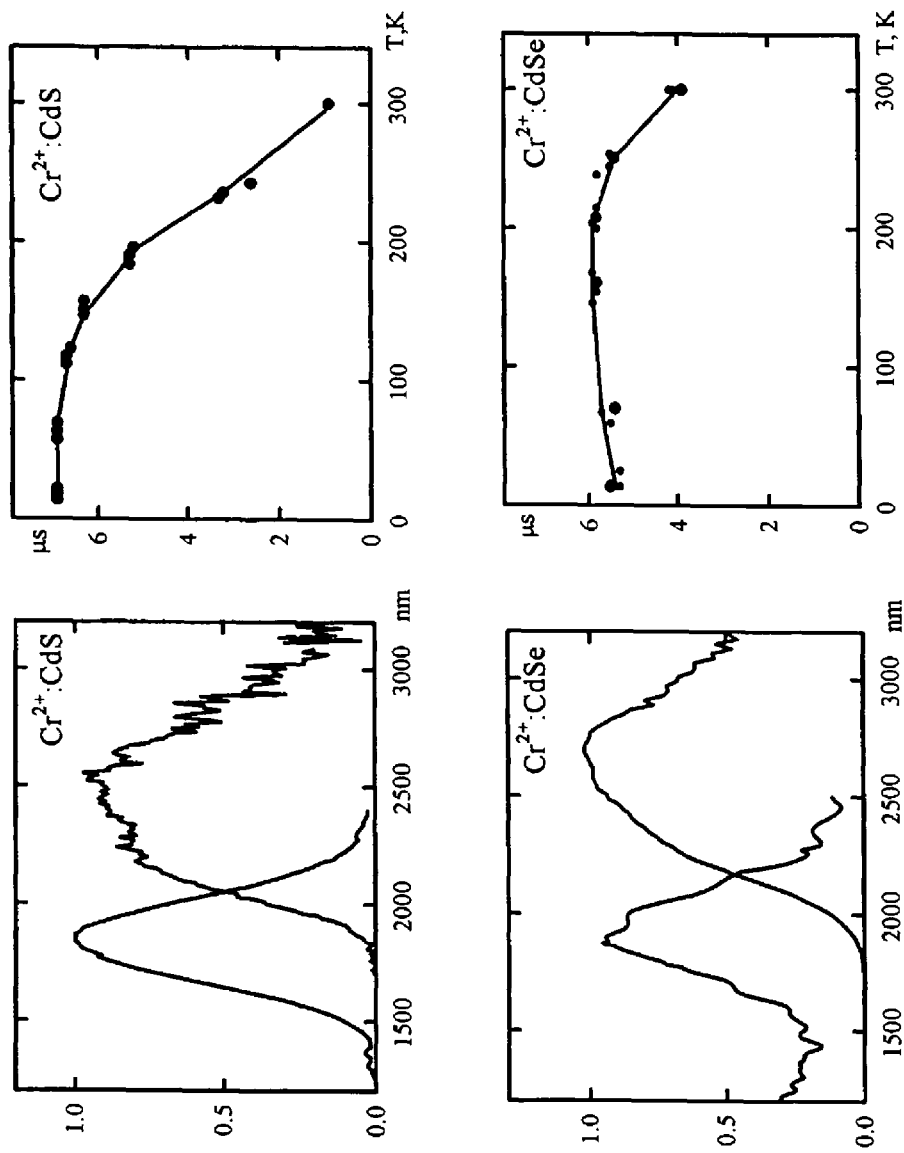
FIG. 3 is a graph of room temperature absorption and emission spectra of $Cr^{2+}$:CdS (A) and $Cr^{2+}$:CdSe (C) crystals prepared according to the invention, measured at 300K, and plotted in cross-sectional units, and corresponding emission lifetime temperature dependences (B, D).

Similar graphs of room temperature absorption and emission spectra of Cr$^{2+}$:CdS (A) and Cr$^{2+}$:CdSe (C) crystals prepared according to the invention, measured at 300K, and plotted in cross-sectional units, and corresponding emission lifetime temperature dependences (B, D) are displayed in FIG. 3.

One of the important potential applications of TM:II_-VI crystals is the passive Q-switching of the resonators of solid state lasers (e.g. Cr$^{2+}$:ZnS crystals for passive Q-switching of Er:glass lasers). Experiments on saturation of Cr$^{2+}$:ZnS absorption were performed under 1.56 µm excitation. The radiation of a D$_2$-Raman-shifted YAG:Nd laser with a pulse duration of 5 ns and pulse energy of up to 20 mJ and repetition rate of 10 Hz was used. Saturation experiments utilized a 2.5 mm thick Cr$^{2+}$:ZnS crystal with initial transmission of T=0.43 at 1.56 µm. The pump radiation was focused on the sample by a 26.5 cm lens and the dependence of the crystal transmission as a function of pumping energy density was measured by means of the sample Z-scanning. Spatial energy distributions of the pump radiation were determined by a standard knife-edge method. The effective radius of the pumping beam was measured at the 0.5 level of maximum pump intensity of radiation.

Figure 4:
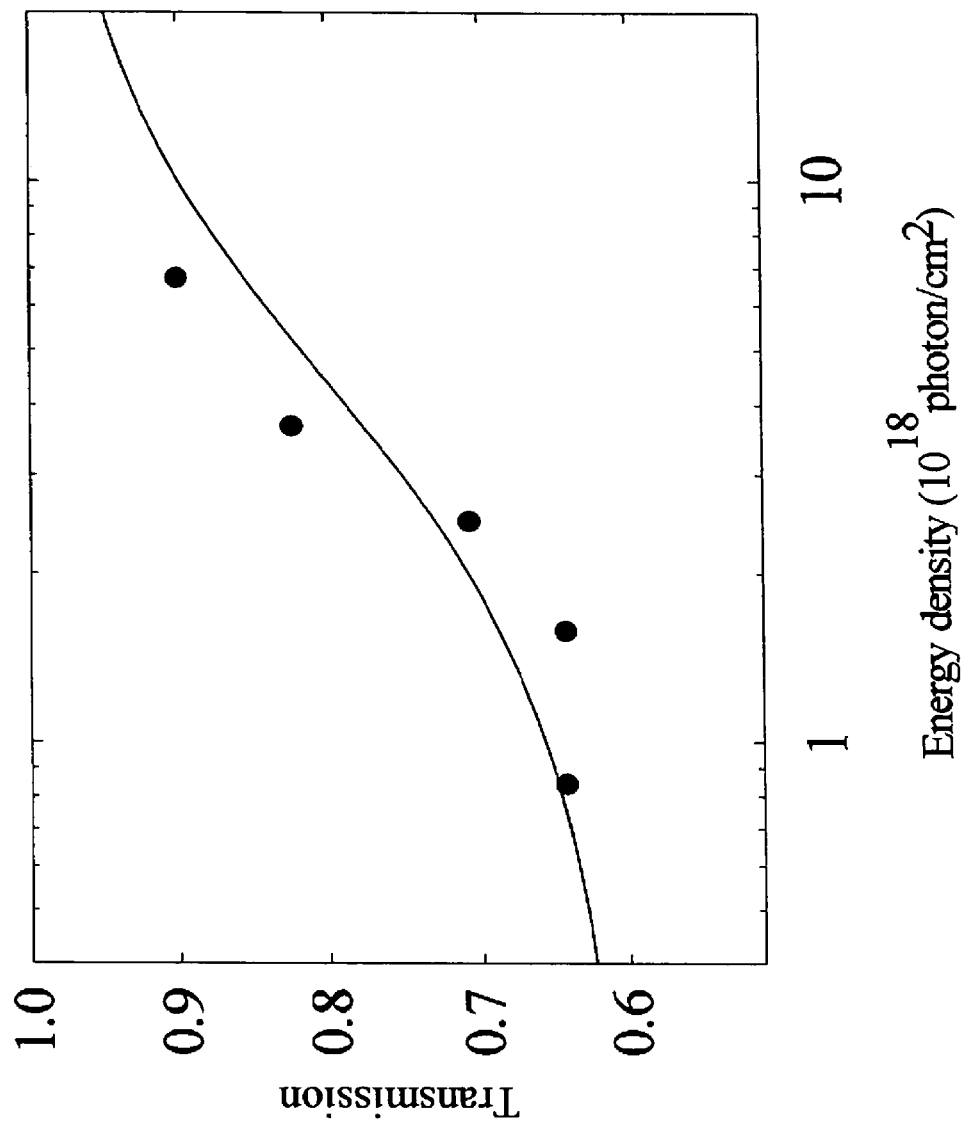
FIG. 4 is a graph of saturation of ground state absorption in $Cr^{2+}$:ZnS crystal. Solid curve is a result of calculation with Frantz-Nodvic equation.

As one can see from FIG. 4, the active absorption changes more than 1.4 times under increasing of pump energy fluence from W=0.8×10$^{18}$ to 6.7×10$^{18}$ photon/cm$^2$. Since the pump pulse duration (5 ns) is much shorter than the relaxation time of Cr$^{2+}$: ZnS saturable absorber (4.5 µs) the saturation behavior was analyzed in terms of energy fluence with a modified Frantz-Nodvik equation for a four level slow absorber. According to this equation the crystal transmission depends on pump energy fluence, "W", and absorption cross section as follows:

$$T = \frac{1}{z}\ln(1 + T_0(e^z - 1)), \quad (3)$$

where z=W $\sigma_{ab}$, T$_o$ crystal transition at W=0, and $\sigma_{abs}$-absorption cross section (cm$^2$). Equation (3) was solved numerically, and from the best fit to the experimental results (FIG. 4, solid line), the value of $\sigma_{abs}$ (λ=1.56 µm) was estimated to be 0.7×10$^{18}$ cm$^2$. Taking into account the ratio of absorption at 1.56 µm and in the maximum of absorption band (λ=1.7 µm, see FIG. 2) the peak absorption cross section was determined to be 1.4×10$^{18}$ cm$^2$, which is in a very good agreement with the value of cross section estimated in the current study from spectroscopic measurements.

The Cr$^{2+}$ concentration in the crystal was 3.5×10$^{18}$ cm$^{-3}$. This satisfactory agreement of $\sigma_{abs}$ values determined from spectroscopic and saturation measurements indicates negligible excited state absorption losses for Cr$^{2+}$:ZnS at 1.56 µm and the wavelength of Er:glass laser oscillation (1.54 µm). Hence, Cr$^{2+}$: ZnS crystals feature a relatively high cross section of absorption 0.7×10$^{-18}$ cm$^2$ at 1.56 µm compared with 7×10$^{-21}$ cm$^2$ for Er: glass. This value is practically two times larger than 0.27×10$^{-18}$ cm$^2$ cross section value for Cr$^{2+}$: ZnSe known in the prior art and in conjunction with negligible excited state absorption losses reveal possible application of Cr$^{2+}$:ZnS crystals as a promising saturable absorber for resonators of Er:glass lasers. In addition to this it is advantageous to utilize for solid state laser Q switching and mode-locking Cr$^{2+}$:ZnS crystals with dichroic mirrors deposited on their faces. These mirrors are supposed to be transparent at the wavelength of solid state laser (e.g. Er-glass laser) oscillation and reflective in the region of Cr$^{2+}$:ZnS lasing. In this coupled cavity configuration Cr$^{2+}$:ZnS element will serve simultaneously as passive Q-switch or mode-locker, as a load for solid state laser, and as an active element. Due to stimulated processes in Cr$^{2+}$:ZnS one can expect that the effective time of depopulation of Cr$^{2+}$:ZnS excited levels will be much faster than for regular arrangement without coupled cavity. It will result in a shorter pulsed duration in a Q-switch regime and even possibility of mode-locked operation.

Figure 5:
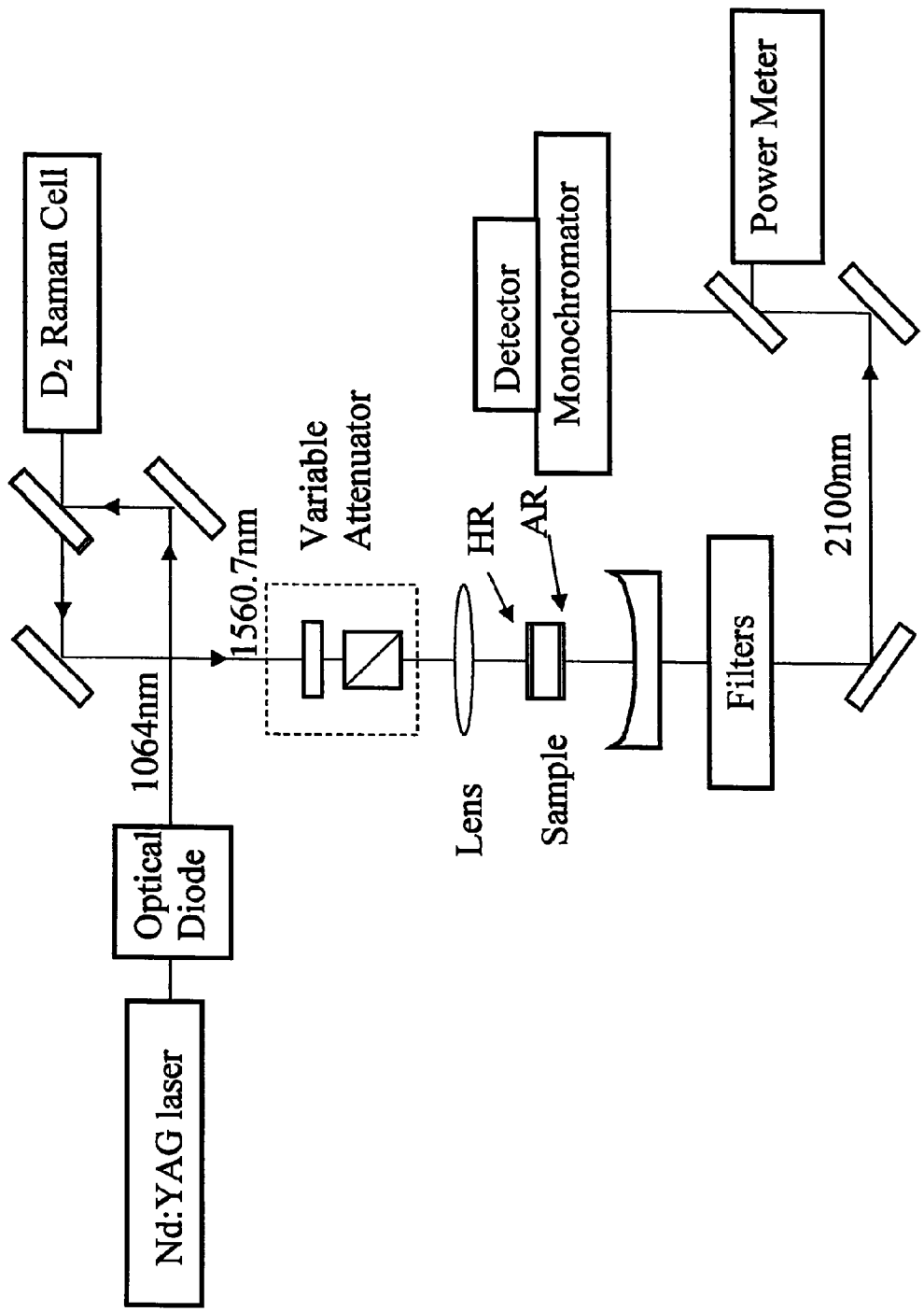
FIG. 5 is a block-diagram of experimental nonselective hemispherical cavity used for $Cr^{2+}$:ZnS gain switched lasing.

A block-diagram of experimental nonselective hemispherical cavity used for Cr$^{2+}$:ZnS gain switched lasing is depicted in FIG. 5. Laser experiments were performed using the 1.5607 µm output from a D$_2$ Raman cell pumped in the backscattering geometry by the 1.064 µm radiation of a Nd:YAG laser. An optical diode was placed before the Raman cell to prevent possible damage of Nd:YAG laser optics by amplified backscattered 1.06 µm radiation. Pump pulses from the Raman cell had pulse duration of 5 ns at FWHM; output energy reached 100 mJ and was continuously attenuated by a combination of a half-wave plate and a Glan prism. Amplitude stability of the pump pulses was about 5%. The hemispherical cavity consisted of the input mirror deposited on the facet of the ZnS crystal and output mirror with 20 cm radius of curvature. Output mirrors had either 10-20% transmission in the spectral region 2.05-2.5 µm, or 20-30% transmission in the spectral region 1.95-2.5 µm. Both mirrors had their peak reflectivity at 2.360 µm. Length of the cavity was 18.5 cm. Pump radiation was focused on the crystal with a 26.5 cm lens placed 22.5 cm before the crystal providing a good match for the pump caustics and the cavity mode size (200 µm). Low doped samples (3-4 cm$^{-1}$ at 1.7 µm) of 1.7 mm thickness were utilized. The second facet of the crystal was anti-reflection (AR) coated in the lasing region and was fully reflective at the wavelength of pumping, providing a double pass pumping scheme. A Ge filter was used to separate residual pump light from the Cr$^{2+}$:ZnS laser beam.

Figure 6:
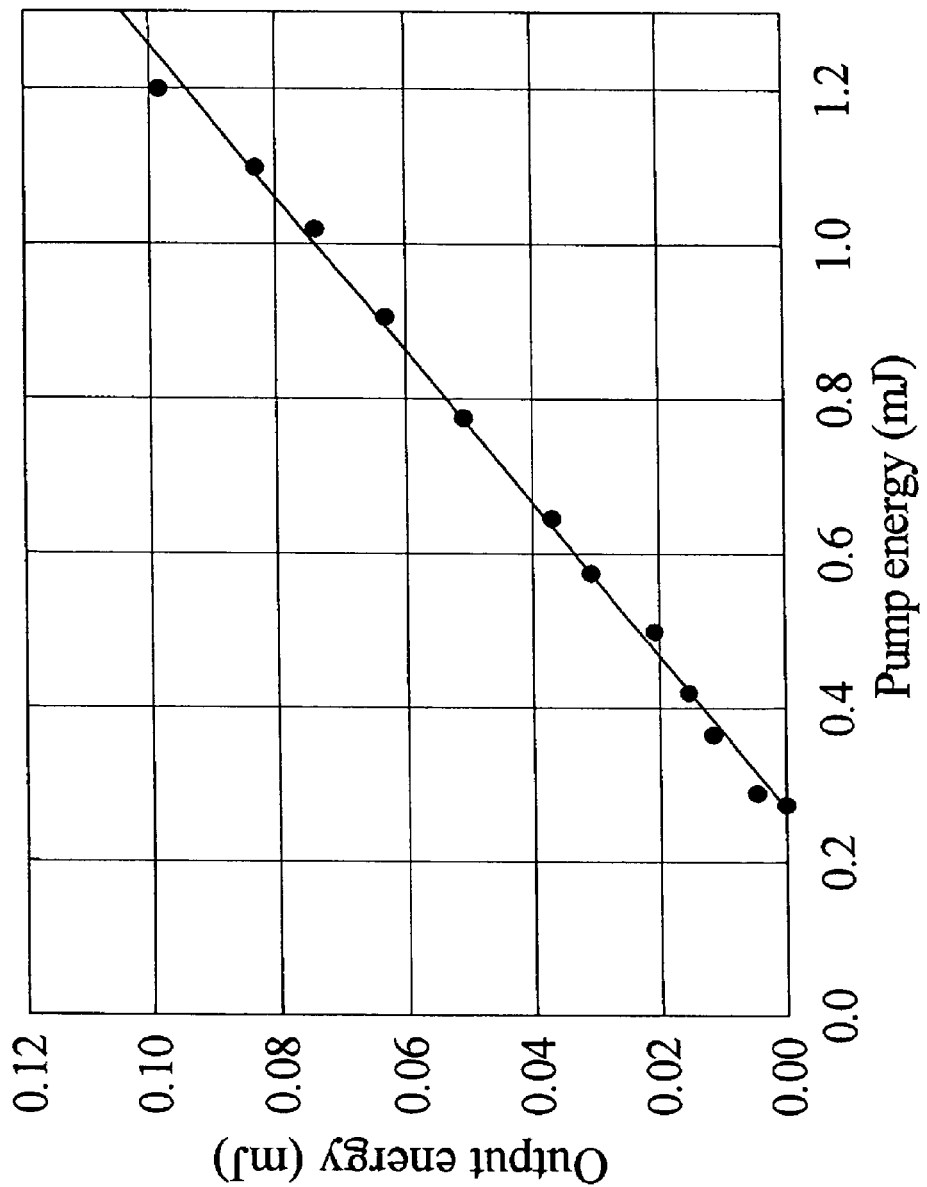
FIG. 6 is a graph of output-input energies of $Cr^{2+}$:ZnS gain switched laser in hemispherical cavity with 10% output coupler. The measured slope efficiency is 9.5%.

Room temperature laser operation was realized with a threshold of 170 µJ and slope efficiency of 9.5% with respect to the pump energy when output coupler R$_{2.360}$ µm=90% was utilized. The laser had an output linewidth of approximately 90 nm (FWHM), centered at 2.24 µm and maximum output energy reached 100 µJ. A graph of output-input energies of Cr$^{2+}$:ZnS gain switched laser in hemispherical cavity is depicted in FIG. 6. Further increase of the pump energy resulted in optical damage of the input mirror. The laser performance of the diffusion doped Cr$^{2+}$:ZnS crystals is expected to be improved by optimization of crystal quality, doping technology and optimization of the output coupler.

With the R$_{2.360}$ µm=80% mirror laser operation was obtained with a threshold of 250 µJ. This allowed a Findlay-Clay calculation of the losses within the cavity[29]. With the crystal length of 1.7 mm and $\sigma_{abs}$=0.8×10$^{-18}$ cm$^2$ the losses in the cavity were calculated to be 14.7%. It is felt that this can also be improved by the optimization of the crystal preparation techniques.

Figure 7:
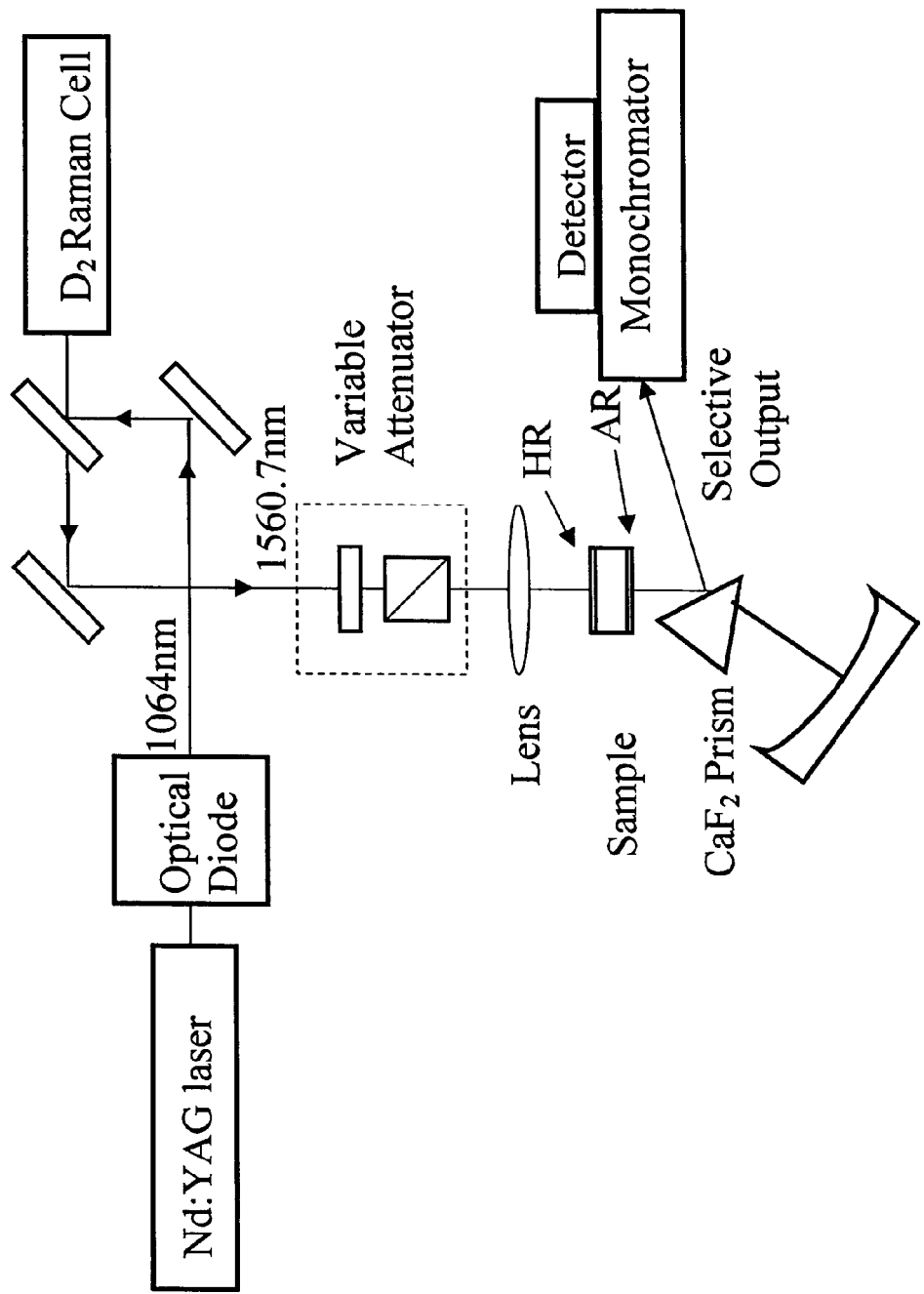
FIG. 7 is a block-diagram of experimental selective hemispherical cavity with $CaF_2$ prism dispersive element used for $Cr^{2+}$:ZnS tunable gain switched lasing.

In the wavelength tuning experiment, depicted in FIG. 7, a hemispherical cavity of the length 19.7 cm was utilized. Wavelength tuning was realized using a CaF$_2$ Brewster prism as the dispersive element placed 5 cm from the output coupler. The focusing lens and crystal remained at the positions that were used in the nonselective cavity. The output coupler was the 20 cm, R$_{2.360}$ µm=90% mirror that was used in the nonselective cavity. This arrangement provided a nice match of the cavity waist and pump beam spot (~200 µm) in the crystal.

Figure 8:
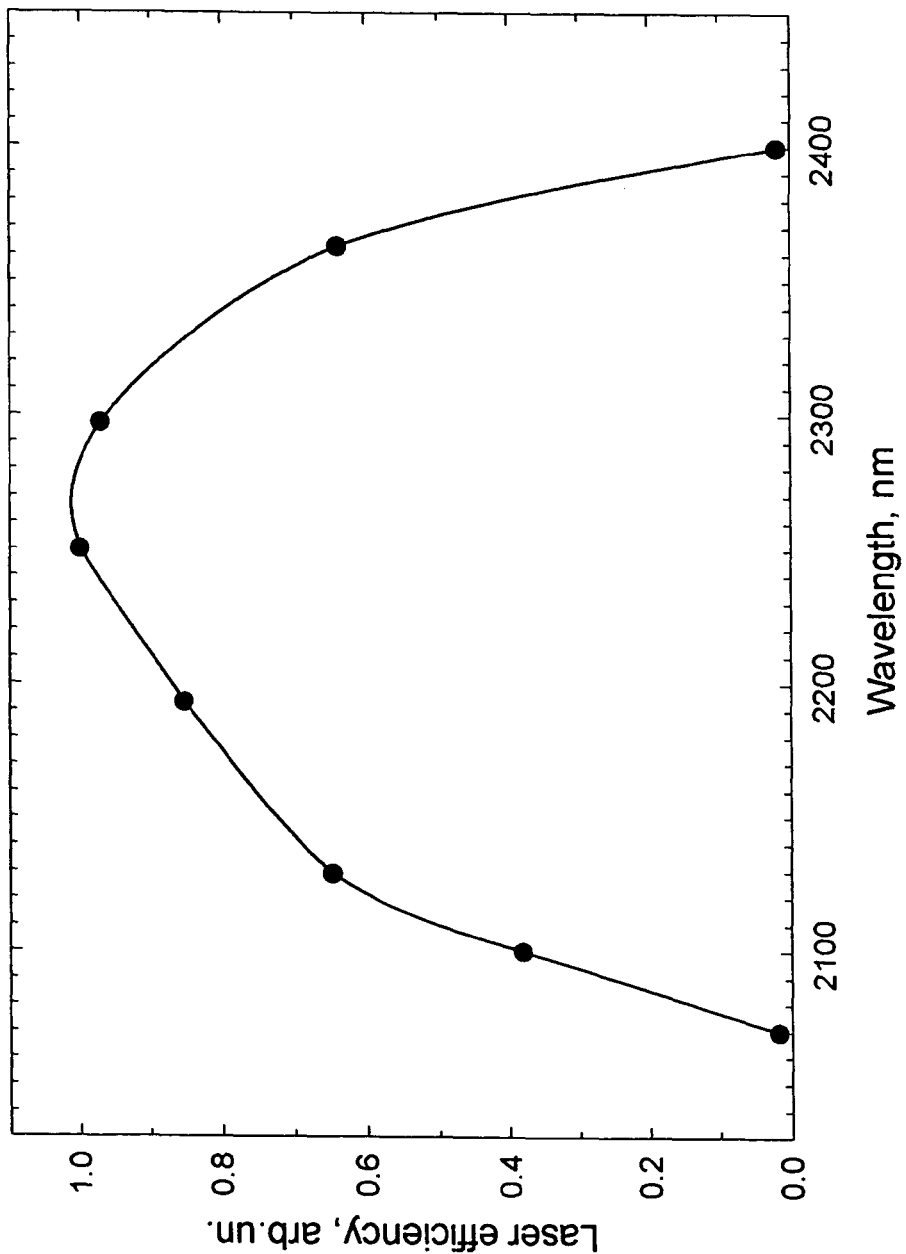
FIG. 8 is a graph of $Cr^{2+}$:ZnS tuning curve with $CaF_2$ prism selector. The tuning is limited by the coatings of available cavity optics. Currently tunability from 2050 to 2800 nm is achieved.

The pump source was operating at 1.5607 µm with the pulse energy of about 600 µJ and 5 ns pulse duration in a TEM$_{00}$ mode. This pump energy was about three times larger than the threshold pump energy level. The Cr$^{2+}$:ZnS laser output was directed through a CaF$_2$ lens to a 0.3 m "Spectra-Pro" monochromator with a PbS detector for wavelength measurements. FIG. 8 demonstrates a continuous wavelength tuning that was realized over the 2.05-2.40 µm spectral region The output of the chromium laser oscillation had a linewidth of approximately 30 nm (FWHM). The peak efficiency of the tunable output was centered at 2.25 µm. The tuning limits were due to coatings of the cavity optics and not the emission spectrum of Cr$^{2+}$:ZnS crystal. The use of proper broadband coatings could potentially increase the tuning range to 1.85-2.7 µm.

The laser output linewidth could be further narrowed by means of a Littrow or Littman configured grating tuned cavity.

Figure 9:
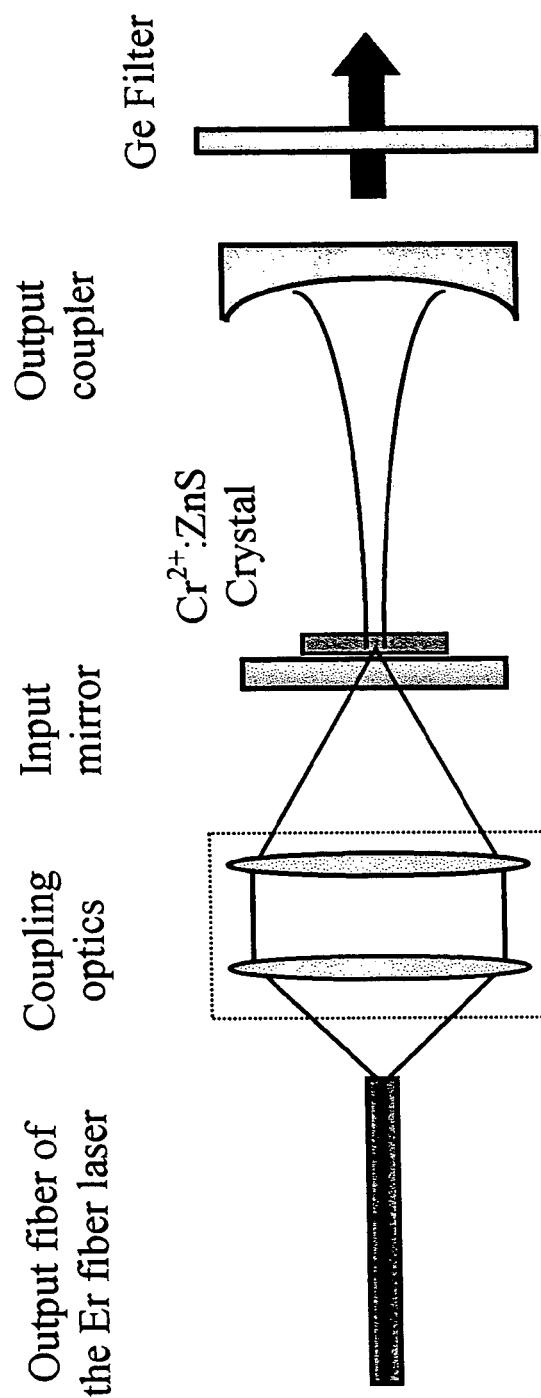
FIG. 9 is a block diagram of experimental set-up for $Cr^{2+}$:ZnS CW lasing under Er fiber laser excitation in external hemispherical cavity.
Figure 10:
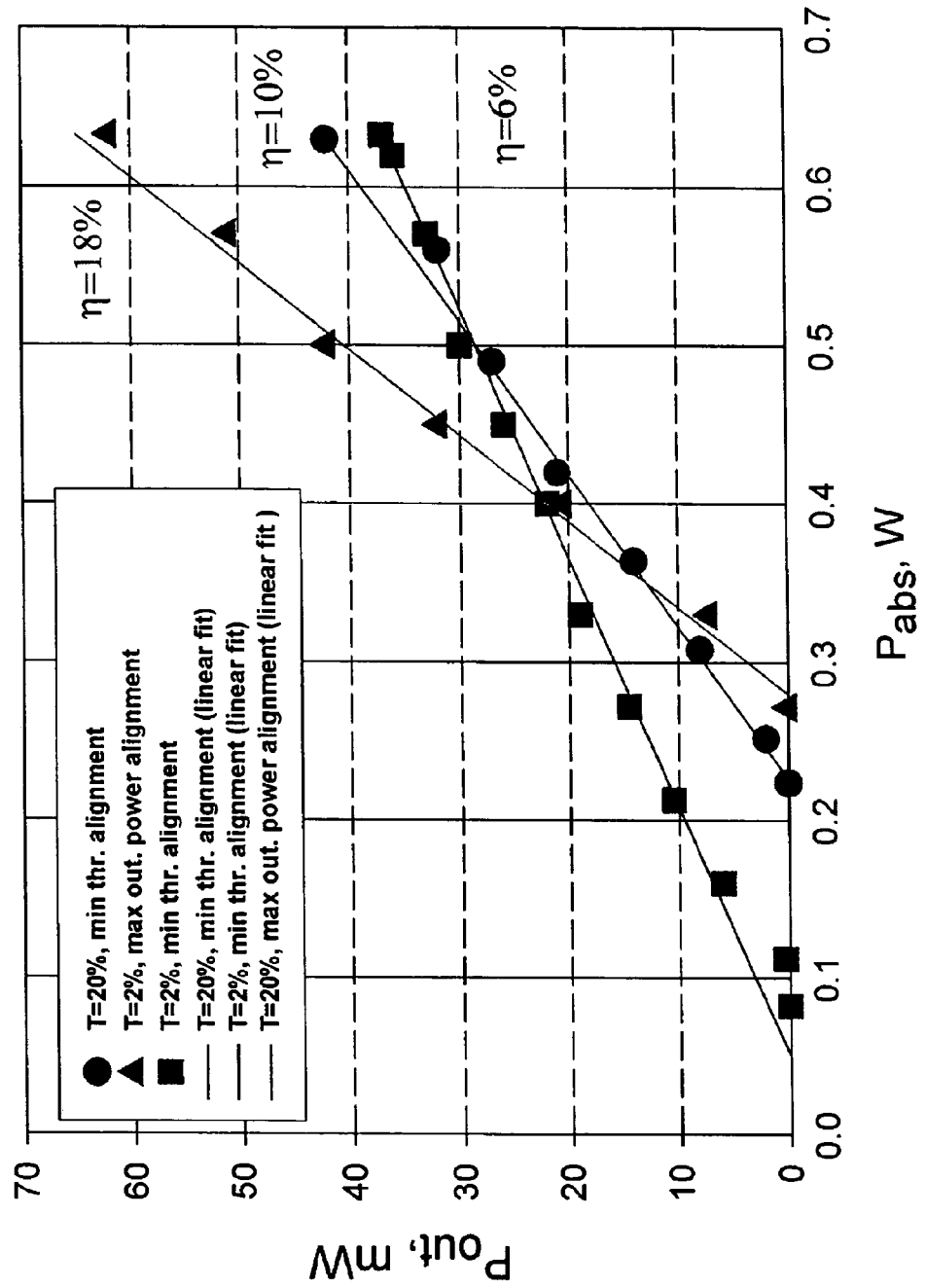
FIG. 10 is a graph of output-input characteristics of the $Cr^{2+}$:ZnS continuous wave laser in hemispherical cavity under 1.55 μm Er-fiber laser pumping with different output couplers; (●) T=20%, and (■) T=2% correspond to minimum threshold adjustment; (▲) T=2%-adjustment to maximum output power.

A block diagram of experimental set-up for Cr$^{2+}$:ZnS CW lasing under Er fiber laser excitation in external hemispherical cavity is depicted in FIG. 9. Pump source was an Erbium Doped Fiber Laser (ELD-2, IPG Photonics). This laser delivers 2W of single mode CW non-polarized radiation at 1550 nm and was equipped with an optical isolator to prevent any possible feedback from the ZnS and ZnSe laser system. The fiber core was 5 µm in diameter. For external non-selective resonator laser experiments, the hemispherical cavity consisted of the flat input mirror and output mirror with 20 cm radius. The input mirror crystal had 99.5% reflectivity in the spectral region from 2.2 to 2.5 µm. The output mirrors had either 2-20% transmission in the spectral region 2.2-2.5 µm, or 20-30% transmission in the spectral region 1.95-2.5 µm. Both output mirrors had their peak reflectivity at 2.360 µm. The antireflection coated chromium doped ZnS crystal with a thickness of 1.1 mm and an absorption coefficient of 5 cm$^{-1}$ at the pump wavelength was utilized. The crystal was mounted on an optical contact to the input flat dichoric mirror made from the YAG crystal for the sake of effective dissipation of heat. The pump radiation of the Er fiber laser was first collimated with a microscope objective in a parallel pencil of light having 1 mm in diameter, and than focused with a second 15 mm focal length objective into the crystal through the input mirror. The output laser parameters were different when the cavity was adjusted to minimum threshold and maximum output power. The output-input dependences for ZnS:Cr$^{2+}$ continuous wave lasing under Er fiber pumping for two different output couplers and for different cavity adjustments to the minimum threshold and maximum output power are depicted in FIG. 10.

The minimum threshold values were measured to be 100 mW and 200 mW of absorbed pump power for output couplers with 2% and 20% transmission, respectively. An output power of 63 mW near 2370 nm at an absorbed pump power of 0.6 W was demonstrated with an output coupler with 2% transmission for maximum output power adjustment. The maximum slope efficiency "η" with respect to the absorbed pump power was 18% in this experiment. The round trip passive losses "L$_d$" in the cavity were estimated to be of 3.7% from the Findley-Clay analysis. The limiting slope efficiency of studied crystal was estimated to be 51% from a Caird analysis of inverse slope efficiency versus inverse output coupling using equation $$\frac{1}{\eta} = \frac{1}{\eta_0}\left(1 + \frac{L_d}{T}\right), \quad (4)$$

where η is the slope efficiency, η$_o$ is the limiting slope efficiency, and T is the mirror transmission. This value is close to the quantum defect of 65% for the studied crystal.

Figure 11:
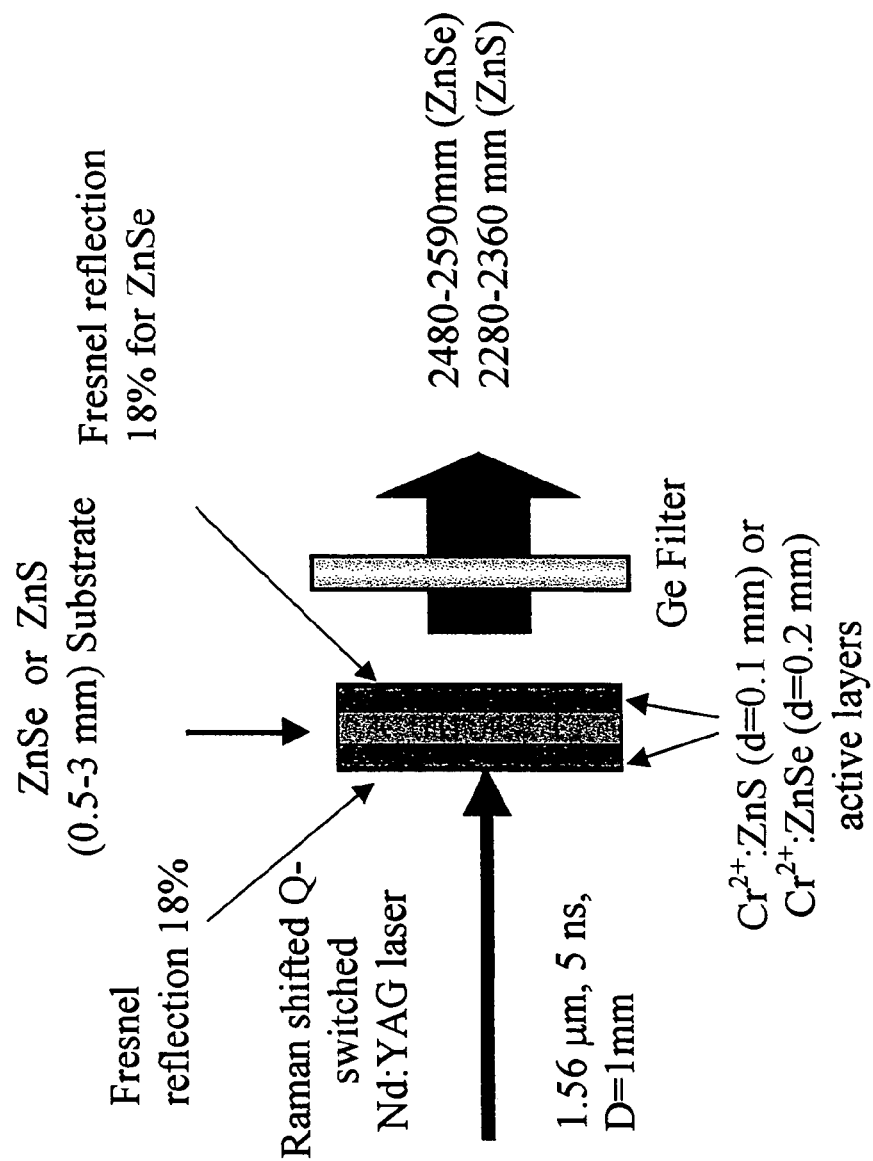
FIG. 11 is a block diagram of $Cr^{2+}$:ZnS and $Cr^{2+}$:ZnSe gain switched microchip lasers with no mirrors deposited on the crystal facets.
Figure 12:
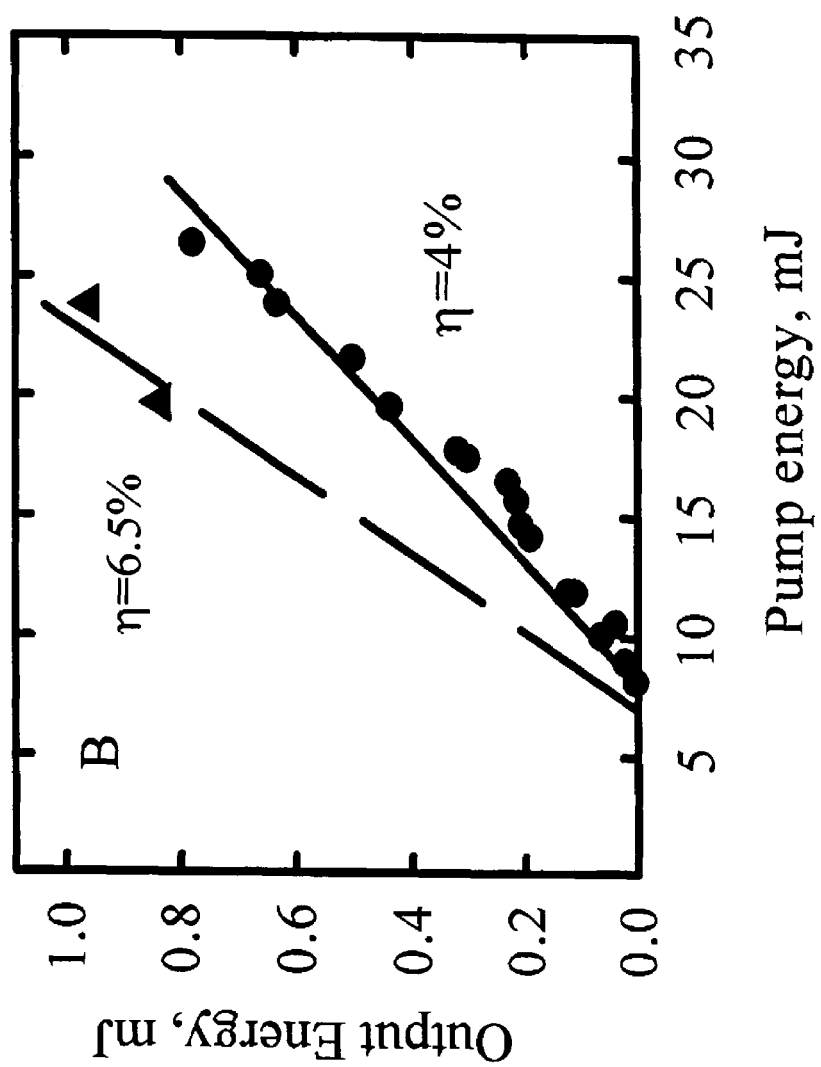
FIG. 12 is a graph of output-input energies for gain switched ZnSe microchip laser with no mirrors deposited on the crystal facets. (▲ and ● represent different excitation spots on the crystal).

A block diagram of Cr$^{2+}$:ZnS and Cr$^{2+}$:ZnSe gain switched microchip lasers with no mirrors deposited on the crystal facets is depicted in FIG. 11. Gain switched microchip laser experiments were performed with Cr$^{2+}$ doped ZnSe and ZnS. The crystal used were 0.5-3 mm thick with polished but uncoated parallel faces and had coefficient of absorption of k~6 cm$^{-1}$ at 1.77 µm. Pumping was from the 1.56 µm output of a D$_2$ Raman shifted Nd:YAG operating at 10 Hz with a pulse duration of about 5 ns and 1.5 mm beam diameter. Output-input energies for pulsed ZnSe microchip lasing for different lasing spots are shown in FIG. 12. Threshold input energy was found to be 7 mJ. A maximum slope efficiency of 6.5% and maximum output power of 1 mJ were obtained for a microchip without mirrors, when positive feedback was only due to the Fresnel reflections. The spectral range of the free-running laser output was from 2270 to-2290 nm.

Figure 13:
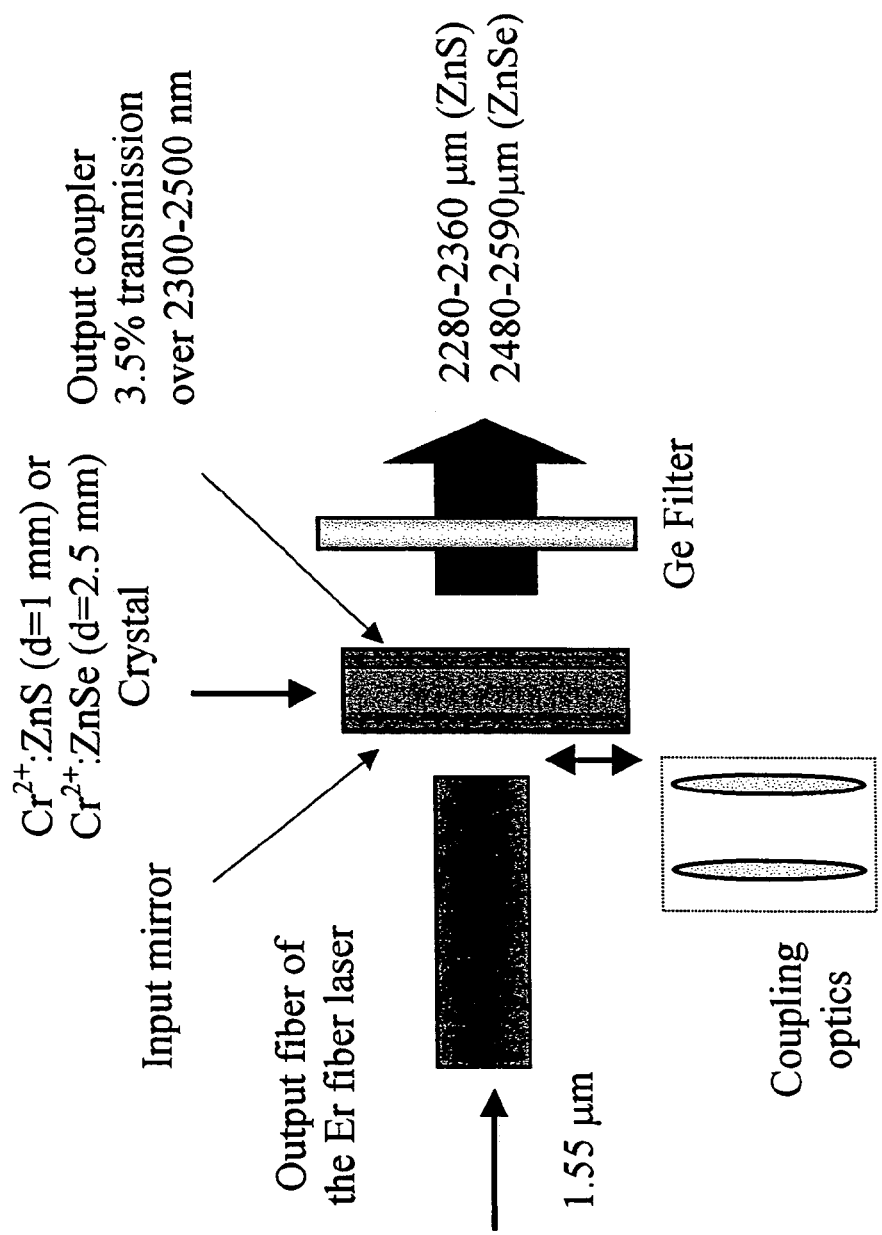
FIG. 13 is a block diagram of experimental set-up for $Cr^{2+}$:ZnS and $Cr^{2+}$:ZnSe CW lasing under Er fiber laser excitation in microchip configuration.
Figure 14:
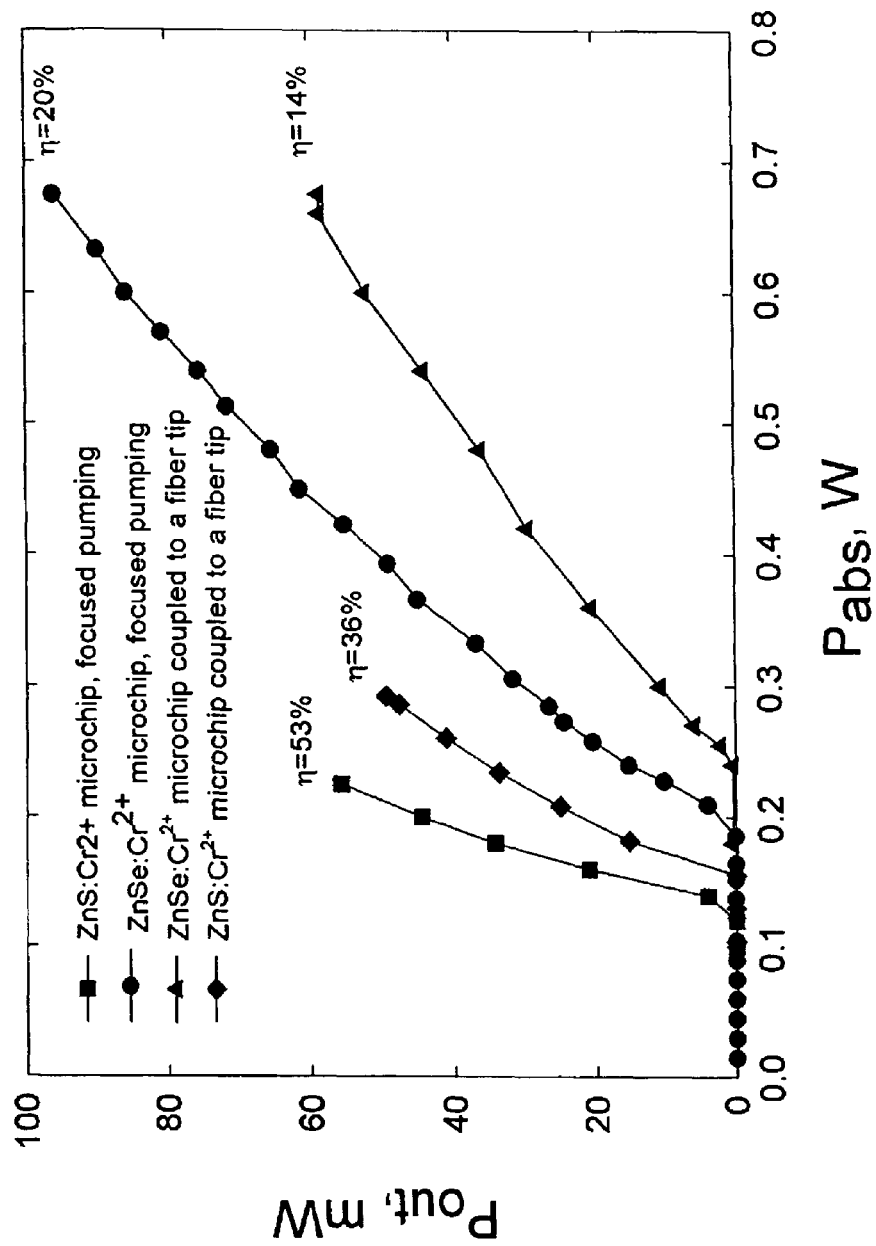
FIG. 14 is a graph of output-input characteristics of the $Cr^{2+}$:ZnS and $Cr^{2+}$:ZnSe continuous wave microchip lasers under 1.55 μm Er-fiber laser pumping.

A block diagram of experimental set-up for Cr$^{2+}$:ZnS and Cr$^{2+}$:ZnSe CW lasing under Er fiber laser excitation in microchip configuration is displayed in FIG. 13. For microchip laser experiments both Cr$^{2+}$:ZnS and Cr$^{2+}$:ZnSe crystals were studied. The crystals were polished flat and parallel (parallelism of ~10") to 1.1 and 2.5 mm thickness, respectively. The mirrors were directly deposited on the parallel polished facets of a thin wafer of laser material. Input and output dichroic mirrors had 0.01 and 3.5% transmission over 2300-2500 nm spectral region, respectively, and their transmission at 1550 nm pumping wavelength was 75%. Two different pump arrangements were utilized. The first one was identical to the pump conditions for the Cr$^{2+}$:ZnS CW lasing in hemispherical cavity when the pump radiation of the Er fiber laser was first collimated with a microscope objective in a parallel pencil of light having 1 mm in diameter, and then focused with a second 15 mm focal length objective into the crystal through the input mirror. The second pump arrangement was provided without any additional optics by means of the microchip laser mounting at a close (~20 um) distance from the tip of the pump Er-fiber laser. In both cases the rather large value of the temperature derivative of the refraction index for ZnS and ZnSe crystals (~5 times larger than for YAG crystal) played a constructive role by means of creating a strong positive lens and providing effective stabilization of the microchip cavity. FIG. 14 shows the output power of the Cr$^{2+}$:ZnS and Cr$^{2+}$:ZnSe microchip laser plotted as a function of absorbed pump power.

Figure 15:
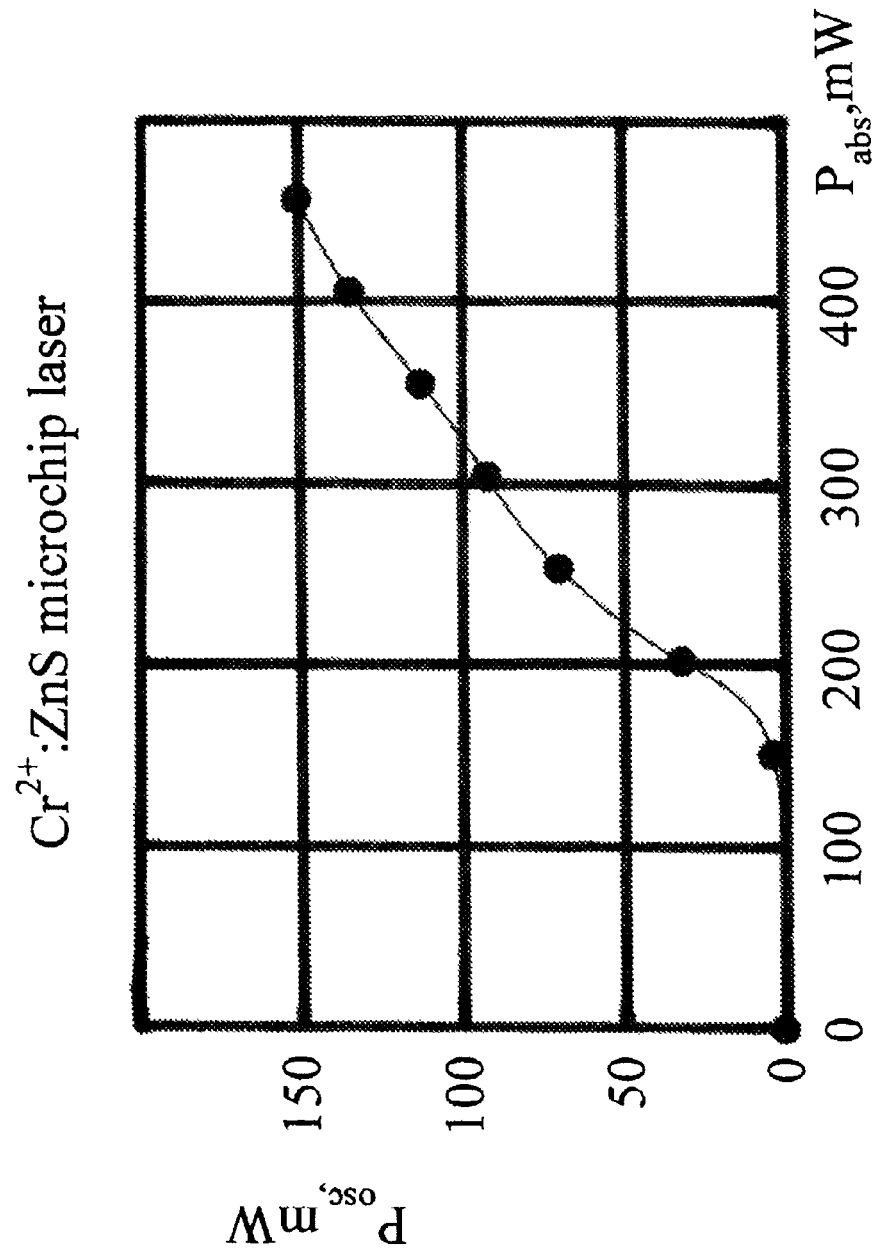
FIG. 15 is a graph of output-input curve of the optimized $Cr^{2+}$:ZnS continuous wave microchip laser under 1.55 μm Er-fiber laser pumping.

In a focused pump beam arrangement a laser threshold of 120 mW and a slope efficiency of 53% with respect to the absorbed pump power were realized for Cr$^{2+}$:ZnS microchip laser. High, close to theoretical limit of 65%, slope efficiency of the microchip laser indicates a good quality of the used crystal. The maximum output power of optimized Cr$^{2+}$:ZnS microchip laser reached 150 mW as demonstrated in FIG. 15.

In the case of ZnSe microchip lasing in a focused pump beam arrangement a laser threshold of 190 mW and a slope efficiency of 20% with respect to the absorbed pump power were demonstrated. The maximum output power reached 100 mW.

For the second pump arrangement, when the microchip lasers were directly coupled to the fiber tip laser thresholds of 150 mW and 240 mW and slope efficiencies of 36 and 14% with respect to the absorbed pump power were realized for $Cr^{2+}$:ZnS and $Cr^{2+}$:ZnSe microchip lasers, respectively. The maximum output power of the $Cr^{2+}$:ZnS microchip laser was practically unchanged while it dropped for $Cr^{2+}$:ZnSe by a factor of 1.6 in comparison to the focused pump arrangement. This can be explained by the excessive length and corresponding mismatch in the mode size and pump beam profile of the ZnSe microchip.

Figure 16:
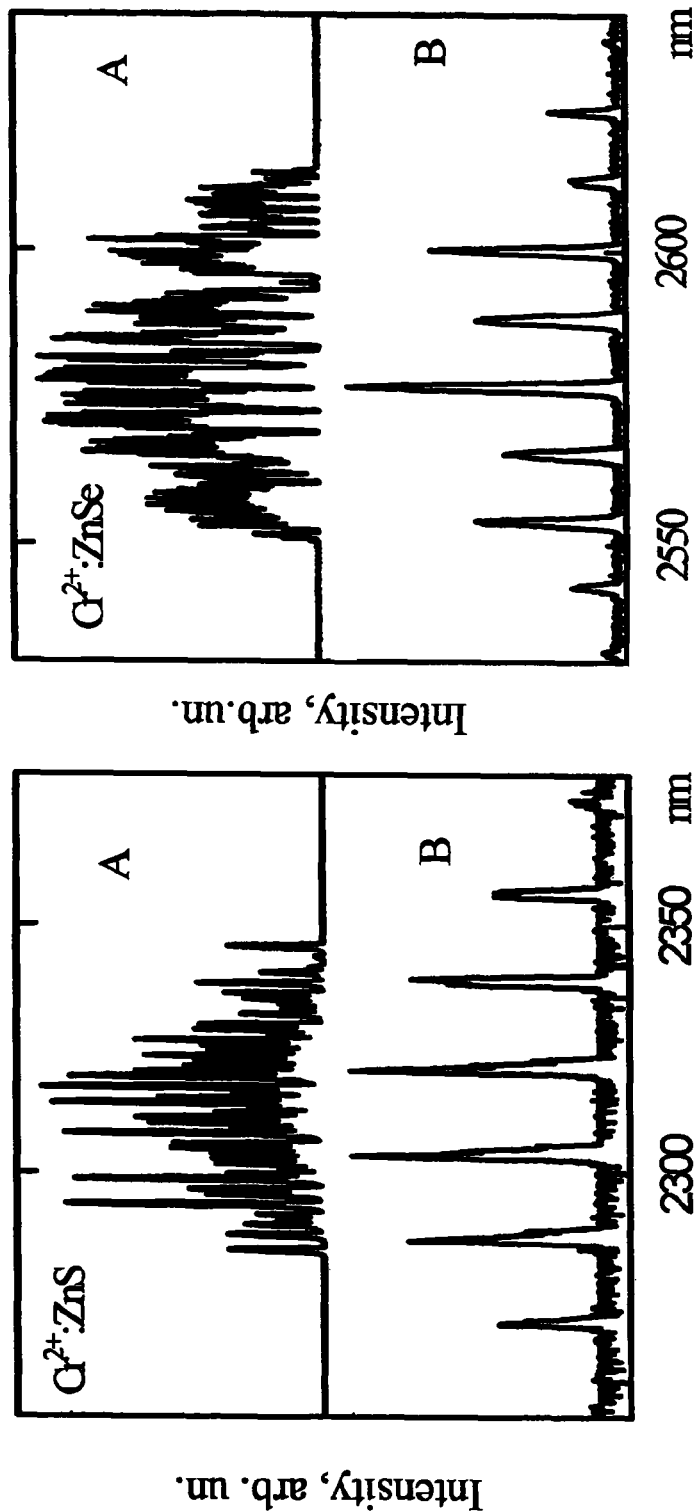
FIG. 16 is a graph of the mode structure of the microchip lasers (A) and coupled cavity (B) microchip lasers (with external etalons) for $Cr^{2+}$:ZnS and $Cr^{2+}$:ZnSe crystals.

The output spectrum in free-running laser operation covered the spectrum range from 2280 to 2360 and from 2480 to 2590 for ZnS and ZnSe microchip lasers, respectively. At maximum pump power the output spectrum of the $Cr^{2+}$:ZnSe laser consisted of more than 100 axial modes with a free spectral range $\Delta v=0.8$ cm$^{-1}$. The typical output spectra of the microchip lasers are depicted in the "A" traces of FIG. 16. Due to a smaller crystal thickness, the free spectral range of the $Cr^{2+}$:ZnS microchip laser was $\Delta v=2$ cm$^{-1}$ and the output spectrum consisted of about 50 axial modes. We attempted to arrange mode control of the microchip lasers by means of a coupled cavity arrangement, with an additional external mirror. The coupled microchip and mirror produced the spectral structure shown in the "B" traces of FIG. 16. In these experiments the number of axial modes decreased to 18-24 modes (each line in FIG. 16B consists of 3 longitudinal modes) for both lasers. This can be further decreased to a single longitudinal mode oscillation in a double cavity configuration using a narrowband output coupler. This experiment demonstrates a feasibility of the microchip single longitudinal mode lasing using a selective output coupler in a combination with the external etalon.

Figure 17:
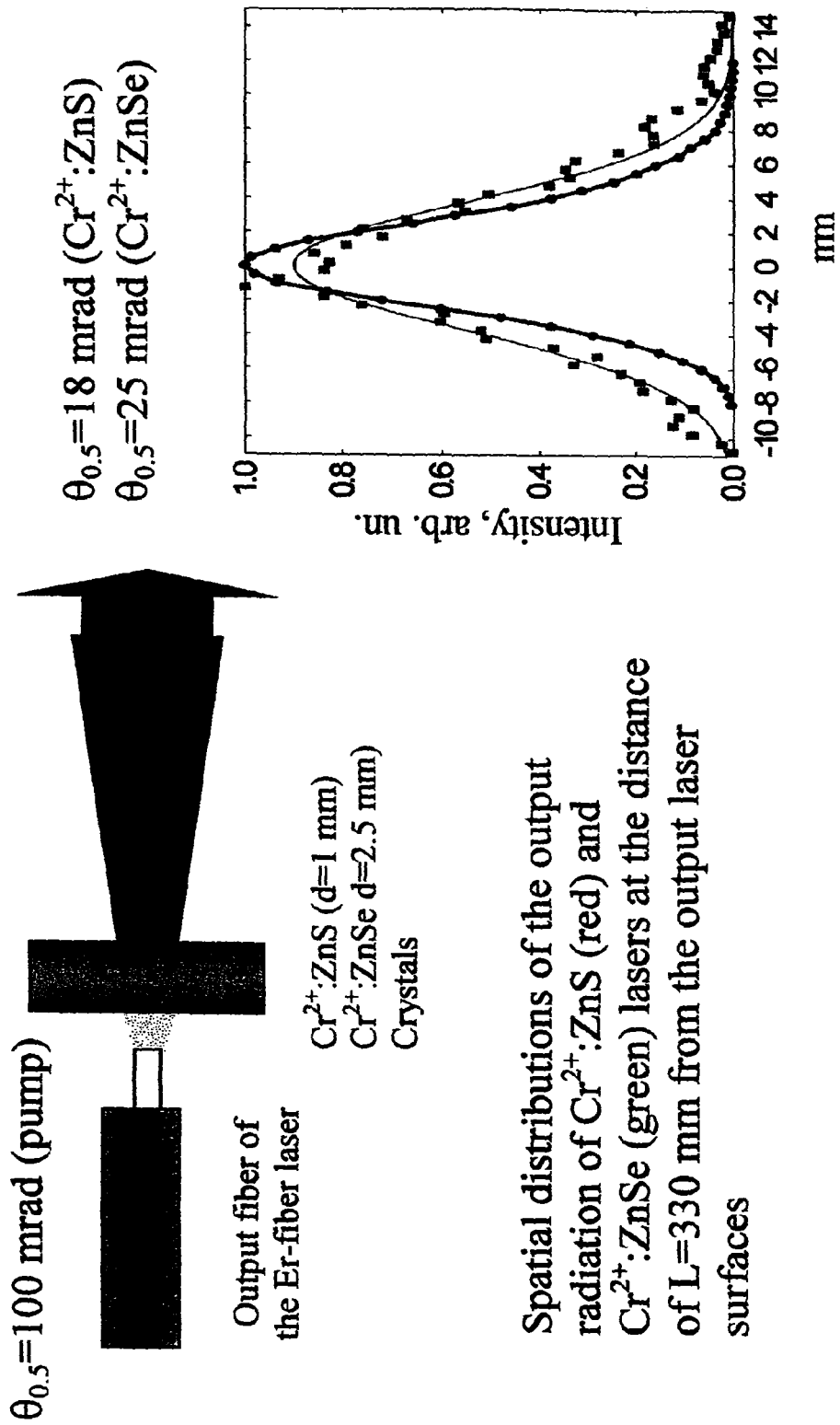
FIG. 17 is a block diagram of experimental set-up for microchip output beam divergence measurements combined with a graph of spatial distribution of the output radiation of $Cr^{2+}$:ZnS (red) and $Cr^{2+}$:ZnSe (green) lasers at a distance of L=330 mm from the output laser surfaces.

FIG. 17 displays a block diagram of experimental set-up for microchip output beam divergence measurements combined with a graph of spatial distribution of the output radiation of $Cr^{2+}$:ZnS (red) and $Cr^{2+}$:ZnSe (green) lasers at a distance of L=330 mm from output laser surfaces. As one can see, a 18 mrad FWHM of the intensity profile was measured for the $Cr^{2+}$:ZnS laser. It is slightly less than that for $Cr^{2+}$:ZnSe laser (25 mrad). Taking thermal effects, that are responsible for cavity stabilization, into account, the divergence difference may be explained by a lower dn/dT in $Cr^{2+}$:ZnS crystal (+46×10$^{-6}$ K$^{-1}$ in ZnS vs.+70×10$^{-6}$ K$^{-1}$ in ZnSe).

Figure 18:
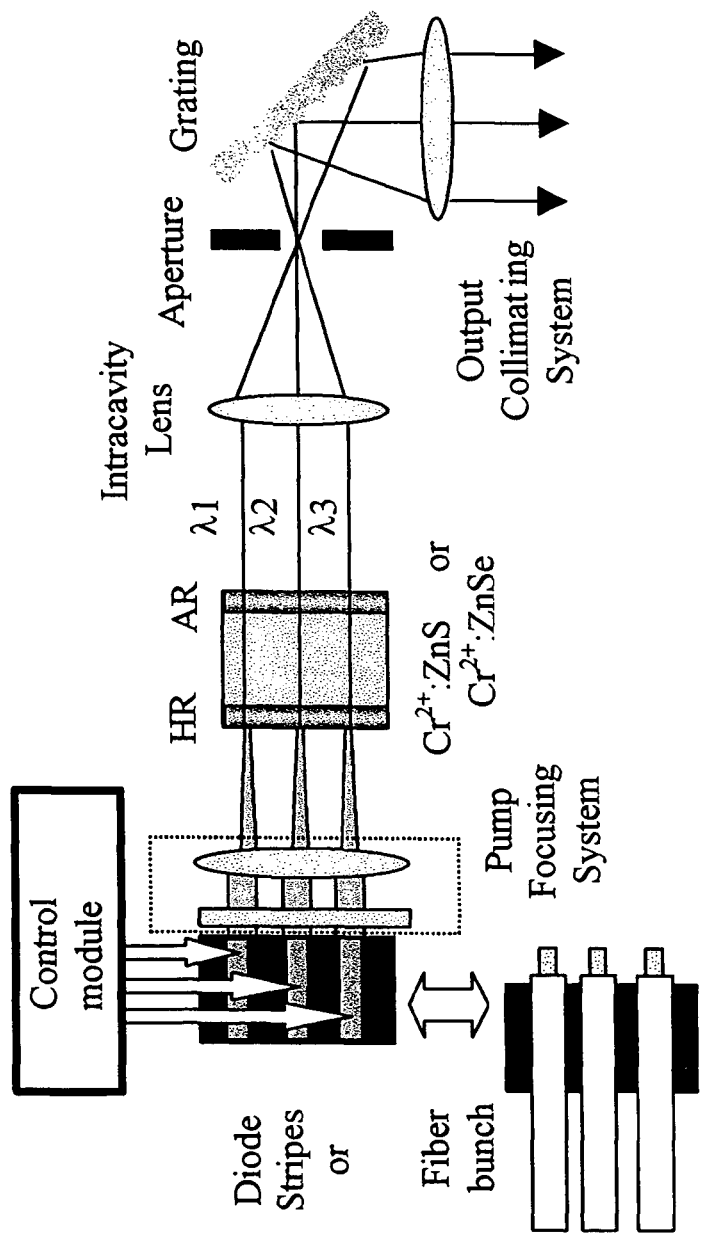
FIG. 18 is a block diagram of "spatially dispersive" cavity made from stand alone components for realization of flexible laser module easily reprogrammable from monochromatic to ultrabroadband and multiline regimes of operation.

The proposed approach of superbroadband/multiwavelength (SBML) system is based on spatial separation of different wavelengths in a single laser cavity. In that regard the teachings of U.S. Pat. Nos. 5,461,635 and 6,236,666 are incorporated herein by reference. The basic optical scheme of the laser transmitter is shown in FIG. 18.

The laser operates as follows. Emission from the spatially separated channels of the active medium passes through the intracavity lens into the off-axis mode suppression element, aperture A, which together with the spatially filtered pump radiation divides active zone of the gain waveguide into a number of channels and separates from the amplified emission of individual channel only part of it that is spread parallel to the resonator axis. This separated radiation is diffracted on the diffraction grating. The Littrow mount grating works as a retroreflector in the auto-collimating regime in the first order of diffraction and returns part of radiation back to the aperture. The off-axis mode suppression element, aperture, in turn extracts from the diffracted radiation only the radiation of the main laser modes. Secondary laser modes, which diverge from the optical axes, are expelled from the process of generation. Hence, the aperture should simultaneously select the fundamental transverse modes for all existing channels in the cavity. The radiation of the main laser modes, each with a distinct wavelength, is collimated by the focusing lens and directed back to the active medium. As FIG. 18 shows, the optical components of the cavity maintain distinct gain channels in the active zone of active element, reduce cross talk, suppress mode competition, and force each channel to lase at specific stabilized wavelength. This approach allows the construction of the laser that emits a plurality of narrow spectral lines that can be easily tailored to any pre-assigned spectral composition within the amplification spectrum of the gain medium. We believe that TM doped II-VI hosts and, specifically, chromium doped ZnS and ZnSe crystals featuring broad amplification spectra are ideal active media for super-broadband and multiline lasing.

There are different schemes that can provide single longitudinal mode operation of Ii-VI microchip laser coupled to external etalon cavity in combination with narrowband output coupler, fiber grating butt-coupling, external grating, hybridly coupled phase array demultiplexer, and waveguide grating mirror.

Figure 19:
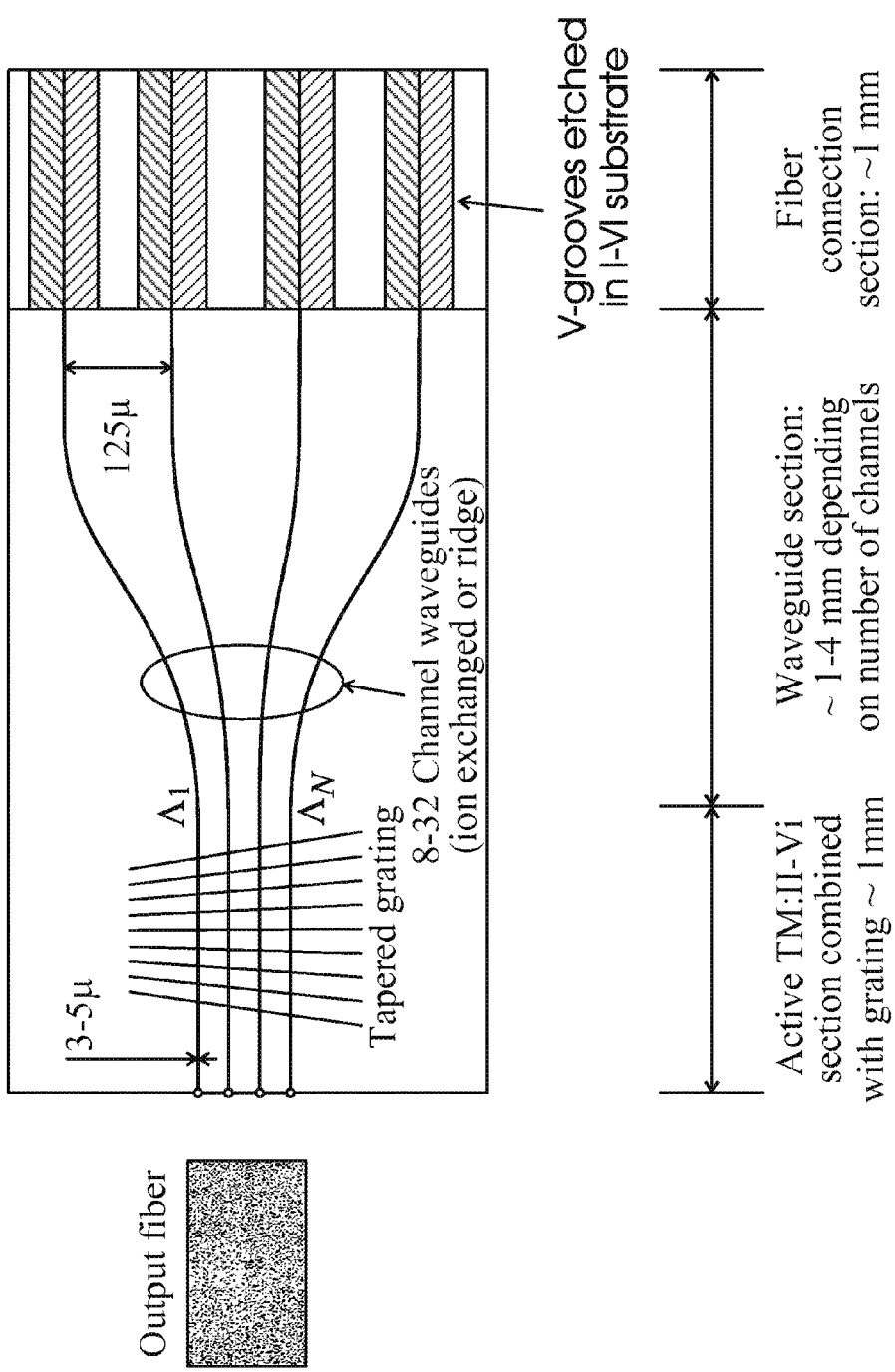
FIG. 19 is a block diagram of a chip scale integrated multiline TM:II-VI laser.

FIG. 19 displays further chip scale integration of multiline TM:II-VI laser. This integrated optical chip is made on II-VI substrate. The chip consists of several sections. The right section has multiple V-grooves etched in II-VI substrate and is provided for connection with fiber lasers or fiber coupled diode lasers. Central section consists of multiple waveguides (e.g. made by ion exchange or ridge technology) and provides delivery of the pump radiation to the active section. The active section consists of multiple II-VI waveguides doped with $TM^{2+}$ and can be further combined with dispersive element such as a tapered grating. Tapered grating, for example, can be provided by exposing active waveguides with UV interference pattern. Utilization of tapered grating provides an autocollimation regime of retroreflection for different wavelengths for each individual active waveguide giving rise to a multifrequency regime of oscillation. Due to electro-optic properties of II-VI materials it is possible to integrate Mach-Zehnder or electro-reflection internal modulator with the active section of the same waveguide (not shown on the Figure). Output multifrequency radiation can be coupled to an output fiber.

There are many other possible schemes of utilization of acousto-optic, electro-optic, photorefractive and birefringent properties of II-VI crystals in one integrated microchip system combining active medium, acousto- or electro-optic modulator, filter, other passive components of the cavity.

While our invention has been disclosed in various forms, this disclosure is not to be construed as limiting the invention solely to these forms, rather the invention is limited solely by the breadth of the claims appended hereto.

BIBLIOGRAPHY

1. C. Sitori, J. Faist, F. Capasso, D. L. Sivco, A. L. Hutchinson, A. Y. Cho, *IEEE Photonics Technology Letters* 9, 294-296 (1997).
2. Y. H. Zhang, *Applied Physics letters* 66, 118-120 (1995).
3. K. S. Abedin, S. Haidar, Y. Konno, C. Takyu, H. Ito, *Applied Optics* 37, 1642-1646 (1998).
4. S. B. Mirov, A. O. Okorogu, W. Lee, D. I. Crouthamel, N. W. Jenkins, K. Graham, A. R. Gallian, A. Yu. Dergachev, W. B. Yan, W. J. Strachan, T. F. Steckroat, D. F. Heller, J. C. Walling, (July 1998) "All solid state laser system, continuously tunable over 0.2-10 micron spectral range" in *Applications of Photonics Technology* 3: *Closing the gap between Theory, Development, and Application*, George A. Lampropoulos, and Roger A. Lessard, Editors, Procedings of SPIE vol. 3491, 1082-1088 (1998).
5. A. O. Okorogu, S. B. Mirov, W. Lee, D. I. Crouthamel, N. Jenkins, A. Yu. Dergachev, K. L. Vodopyanov, V. V.

Badikov, "Tunable Mid Infrared Downconversion in GaSe and AgGaS$_2$," Optics Comm. 155, 307-313 (1998).
6. L. D. DeLoach, R. H. Page, G. D. Wilke, S. A. Payne, and W. F. Krupke, "Transition Metal-Doped Zinc Chalcogenides: Spectroscopy and Laser Demonstration of a New Class of Gain Media", IEEE J. Quantum Electron 32 885-895 (1996).
7. R. H. Page, K. I. Schaffers, L. D. DeLoach, G. D. Wilke, F. D. Patel, J. B. Tassano, S. A. Payne, W. F. Krupke, K. T. Chen, A. Burger, "Cr$^{2+}$-Doped Zinc Chalcogenides as Efficient, Widely Tunable Mid-Infrared Lasers", IEEE J. Quantum Electron 33/4 609-617 (1997).
8. K. Graham, S. B. Mirov, V. V. Fedorov, M. E. Zvanut, A. Avanesov, V. Badikov, B. Ignat'ev, V. Panutin, G. Shevirdyaeva, "Spectroscopic characterization and laser performance of diffusion doped Cr2+:ZnS", *OSA Trends in Optics and Photonics on Advanced Solid State Lasers*, S. Payne and C. Marshall, Eds. (Optical Society of America, Washington, D.C. 2001) Vol. 46.
9. K. Graham, S. B. Mirov, V. V. Fedorov, M. E. Zvanut, A. Avanesov, V. Badikov, B. Ignat'ev, V. Panutin, G. Shevirdyaeva, "Spectroscopic characterization and laser performance of diffusion doped Cr2+:ZnS", in Advanced Solid State Lasers, OSA Technical Digest (Optical Society of America, Washington D.C., 2001), pp. WB12-1-WB12-3.
10. K. Graham, S. Mirov, V. Fedorov, M. E. Zvanut, A. Avanesov, V. Badikov, B. Ignat'ev, V. Panutin, G. Shevirdyaeva, "Laser performance of Cr2+ doped ZnS", in Solid State Lasers X, Richard Scheps, Editor, Proc. SPIE 4267, 81-88 (2001).
11. G. J. Wagner, T. J. Carrig, R. H. Page, K. I. Schaffers, J. O. Ndap, X. Ma, A. Burger, "Continuous-wave broadly tunable Cr$^{2+}$: ZnSe laser", Opt. Lett. 24, 19-21 (1999).
12. A. V. Podlipensky, V. G. Shcherbitsky, N. V. Kuleshov, V. I. Levchenko, V. N. Yakimovich, A. Diening, M. Mond, S. Kuck, G Huber, "1W continuous-wave laser generation and excited state absorption measurements in Cr$^{2+}$: ZnSe", *OSA Trends In Optics and Photonics, Advanced Solid State Lasers*, Hagop Injeyan, Ursula Keller, and Christopher Marshall, Eds 34 201-206 (Optical Society of America, Washington, D.C., 2000).
13. I. T. Sorokina, E. Sorokin, A. D. Lieto, M. Tonelli, R. H. Page, K. I. Schaffers, "0.5W efficient broadly tunable continuous-wave Cr$^{2+}$: ZnSe laser", *OSA Trends In Optics and Photonics, Advanced Solid State Lasers*, Hagop Injeyan, Ursula Keller, and Christopher Marshall, eds 34 188-193 (Optical Society of America, Washington, D.C., 2000).
14. A. Sennaroglu, A. O. Konea, C. R. Pollock, "Power performance of a continuous-wave Cr$^{2+}$: ZnSe laser at 2.47 µm", *OSA Trends In Optics and Photonics, Advanced Solid State Lasers*, Hagop Injeyan, Ursula Keller, and Christopher Marshall, Eds 34, 240-245 (Optical Society of America, Washington, D.C., 2000).
15. T. J. Carrig, G. J. Wagner, A. Sennaroglu, J. Y. Jeong, C. R. Pollock, "Acousto-optic mode-locking of a Cr$^{2+}$: ZnSe laser", *OSA Trends In Optics and Photonics, Advanced Solid State Lasers*, Hagop Injeyan, Ursula Keller, and Christopher Marshall, Eds 34, 182-187 (Optical Society of America, Washington, D.C., 2000).
16. G. J. Wagner, T. J. Carrig, "Power scaling of Cr$^{2+}$:ZnSe lasers", in Advanced Solid State Lasers, OSA Technical Digest (Optical Society of America, Washington D.C., 2001), pp. WB1-1-WB 1-4.
17. M. Mond, E. Heumann, H. Kretschmann, S. Kuck, G. Huber, V. I. levchenko, V. N. Yakimovich, A. V. Podlipensky, V. G. Shcherbitsky, N. V. Kuleshov, "Continuous wave diode pumped Cr$^{2+}$:ZnSe and high power laser operation," in Advanced Solid State Lasers, OSA Technical Digest (Optical Society of America, Washington D.C., 2001), pp. MC3-1-MC3-3.
18. E. Sorokin, I. T. Sorokina, "Room-temperature CW diode-pumped Cr$^{2+}$ZnSe laser", in Advanced Solid State Lasers, OSA Technical Digest (Optical Society of America, Washington D.C., 2001), pp. MB11-1-MB11-3.
19. U. Hommerich, X. Wu, V. R. Davis, S. B. Trivedi, K. Grasza, R. J. Chen, S. Kutcher, "Demonstration of room-temperature laser action at 2.5 µm from Cr$^{2+}$: Cd$_{0.85}$Mn$_{0.15}$Te", Opt. Lett 22, 1180-1182 (1997).
20. J. McKay, D. Kraus, K. L. Schepler, "Optimization of Cr$^{2+}$: CdSe for Efficient laser Operation", *OSA Trends In Optics and Photonics, Advanced Solid State Lasers*, Hagop Injeyan, Ursula Keller, and Christopher Marshall, Eds 34 219-224 (Optical Society of America, Washington, D.C., 2000).
21. J. J. Adams, C. Bibeau, S. A. Payne, R. H. Page, "Tunable laser action at 4.0 microns from Fe:ZnSe", in Advanced Solid State Lasers, OSA Technical Digest (Optical Society of America, Washington D.C., 2001).
22. T. T. Basiev, S. B. Mirov, P. G. Zverev, I. V. Kuznetsov, R. Sh. Tedeev, (October 1995) Solid State Laser with Superbroadband or Control Generation Spectrum. U.S. Pat. No. 5,461,635.
23. S. B. Mirov, T. T. Basiev, (May 22, 2001) "Semiconductor Laser with a Superbroadband or Multiline Spectral Output", U.S. Pat. No. 6,236,666.
24. I. Moskalev, S. Mirov, V. Fedorov, T. Basiev, G. Grimes, E. Berman, "External cavity multiline semiconductor laser for WDM applications" in In-Plane Semiconductor Lasers V, Like J. Mawst and Ramon Martinelli, Editors, Proc. SPIE 4287, 128-137 (2001).
25. T. T. Basiev, P. G. Zverev, V. F. Fedorov, S. B. Mirov (April 1997) Multiline, superbroadband and sun-color oscillation of LiF:F$_2^-$ color center laser, *Applied Optics,* 36, 2515-2522 (1997).
26. G. Grebe and H. J. Schulz, "Luminescence of Cr$^{2+}$ centers and related optical interactions involving crystal field levels of chromium ions in zinc sulfide", Z. Naturforsch 29a 1803-1818 (1974).
27. C. S. Kelley and F. Williams, Phys. Rev. B, 2, 3-8 (1970).
28. A. V. Podlipensky, V. G. Shcherbitsky, N. V. Kuleshov, V. P. Mikhailov, V. I. Levchenko, and V. N. Yakimovich, "Cr$^{2+}$: ZnSe and Co$^{2+}$: ZnSe saturable-absorber Q switches for 1.54-µm Er:glass lasers," Opt. Lett. 24/14, 960-962 (1999).
29. D. Findlay and R. A. Clay, "The Measurement of Internal Losses in 4-Level Lasers", Phys. Lett 20/3, 277-278 (1966).
30. J. A. Caird, S. A. Payne, P. R. Staver, A. J. Ramponi, L. L. Chase, W. F. Krupke, IEEE J. Quantum Electron QE-24, 1077 (1988).
31. J. Izawa, H. Nakajima, H. Hara, Y. Arimoto, "A tunable and longitudinal mode oscillation of a Tm, Ho:YLF microchip laser using an external etalon," Optics Commun., 180, 137-140 (2000).
32. N. Vasa, P. Husayin, M. Kidosaki, T. Okada, M. Maeda, T. Mizunami, "Fiber grating butt-coupled cw Cr$^{3+}$:LiSrAlF$_6$ laser performance," in *Conference on Lasers and Electro-Optics*, Vol. 6, 1998, OSA Technical Digest series (Optical Society of America, Washington D.C., 1998) pp. 67-68.
33. D. V. Thourhout, A. V. Hove, T. V. Caenegem, K. Vandeputte, P. Vandaele, I. Moerman, X. Leijtens, M. K. Smit, R. Baets, "Realization of a Phased-Array Multi- Wavelength laser using hybridly integrated PICs", in 2000 Electronic Components and Technology Conference, 1266-1271, 2000.

35. I. Avrutsky, R. Rabady, "Waveguide grating mirror for large-area semiconductor lasers", Opt. Letts., 26, 989-991 (2001).

What we claim is:

1. A laser transmitter comprising:
a pump radiation source configured to generate radiations in spatially separate channels;
a substrate, integrated on an optical chip, comprising a fiber connection to receive pumped radiations from the pump radiation source, the substrate further comprising etchings to couple the spatially separate channels of the pumped radiation to respective spatially separated channels on the substrate and multiple waveguides to deliver the radiation in the spatially separate channels to an active gain medium;
the active gain medium, integrated as part of the substrate, comprising the multiple waveguides and having broad amplification spectra to emit amplified radiations of the spatially separate channels, each channel representing a corresponding wavelength, the active gain medium including a tapered grating structure formed across the multiple waveguides such that a spacing between periodic components of the grating structure gradually increases between a first waveguide and a last waveguide of the multiple waveguides to provide an autocollimation regime of retroreflection for multifrequency oscillation of the pumped radiation that enters the active region, the active gain medium comprising II-VI material; and
one of an acousto-optic modulator or an electro-optic modulator integrated as part of the active gain medium within a cavity of the laser transmitter.

2. The laser transmitter of claim 1, further comprising a pump focusing system to focus the radiations generated by the pump radiation source towards the active gain medium.

3. The laser transmitter of claim 1, wherein the active gain medium comprises chromium doped ZnS crystals or chromium doped ZnSe crystals or both.

4. The laser transmitter of claim 1, wherein the pump radiation source comprises an array of diode stripes or a fiber bunch.

5. The laser transmitter of claim 1, wherein the multiple waveguides of the active gain medium comprise II-VI material doped with $TM^{2+}$ that provides output amplified radiations in the range from approximately 1850 to 2700 nm.

6. The laser transmitter of claim 1, wherein the laser transmitter is a laser module that is reprogrammable to operate in one of a monochromatic, ultrabroadband or multiline regime of operation.

* * * * *